(12) United States Patent
Kitagawa et al.

(10) Patent No.: US 11,346,524 B2
(45) Date of Patent: May 31, 2022

(54) VENTILATION HOUSING

(71) Applicant: NITTO DENKO CORPORATION, Ibaraki (JP)

(72) Inventors: Daisuke Kitagawa, Ibaraki (JP); Youzou Yano, Ibaraki (JP); Satoshi Nishiyama, Ibaraki (JP); Tiago Ogawa, Ibaraki (JP); Masahiko Takeuchi, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/284,062

(22) PCT Filed: Oct. 11, 2019

(86) PCT No.: PCT/JP2019/040282
§ 371 (c)(1),
(2) Date: Apr. 9, 2021

(87) PCT Pub. No.: WO2020/075848
PCT Pub. Date: Apr. 16, 2020

(65) Prior Publication Data
US 2021/0404627 A1  Dec. 30, 2021

(30) Foreign Application Priority Data
Oct. 11, 2018  (JP) .............................. JP2018-192899

(51) Int. Cl.
*F21S 45/33* (2018.01)
*F24F 13/20* (2006.01)

(52) U.S. Cl.
CPC .............. *F21S 45/33* (2018.01); *F24F 13/20* (2013.01)

(58) Field of Classification Search
CPC . F21F 13/20; F21S 45/33; F21S 8/033; F21V 29/74; F21V 21/02; F21V 19/001; F21V 15/01
See application file for complete search history.

(56) References Cited

U.S. PATENT DOCUMENTS 6,364,924 B1   4/2002  Mashiko et al.
2009/0084078 A1   4/2009  Furuyama et al.
(Continued)

FOREIGN PATENT DOCUMENTS

JP   2001-143524 A   5/2001
JP   2005-349362 A   12/2005
(Continued)

OTHER PUBLICATIONS

Jan. 7, 2019 International Search Report issued in International Patent Application No. PCT/JP2019/040282.

*Primary Examiner* — Anne M Hines
(74) *Attorney, Agent, or Firm* — Oliff PLC

(57) ABSTRACT

A ventilation housing includes a housing and ventilation component. A housing tubular projecting part has a communicating hole between housing inner and outer spaces. The ventilation component has: an attachment member over the projecting part with a contacting inner surface; an attachment member supported ventilation body covering a hole end portion between the inner and outer spaces; and a covering member including peripheral and top parts over the attachment member. At least one ventilation path connects the ventilation body and the outer space. A first contact part between an attachment member outer surface outermost protruding portion and covering member peripheral part inner surface is closer to the inner space than an end portion on the outer space side in a second contact part being a (Continued)

contact portion between the housing projecting part outer surface and the attachment member inner surface.

11 Claims, 20 Drawing Sheets

(56) References Cited

U.S. PATENT DOCUMENTS

| | | | |
|---|---|---|---|
| 2010/0227544 | A1 | 9/2010 | Furuyama et al. |
| 2013/0139484 | A1 | 6/2013 | Furuyama et al. |
| 2014/0090561 | A1 | 4/2014 | Furuyama et al. |
| 2015/0276244 | A1 | 10/2015 | Ishii et al. |
| 2016/0174397 | A1 | 6/2016 | Ishii et al. |
| 2018/0356065 | A1 | 12/2018 | Yano |
| 2019/0389363 | A1* | 12/2019 | Kim .................... F21S 45/33 |

FOREIGN PATENT DOCUMENTS

| | | |
|---|---|---|
| JP | 2007-087929 A | 4/2007 |
| JP | 2007-186189 A | 7/2007 |
| JP | 2015-033682 A | 2/2015 |
| JP | 2017-111916 A | 6/2017 |
| WO | 2014/068902 A1 | 5/2014 |

\* cited by examiner

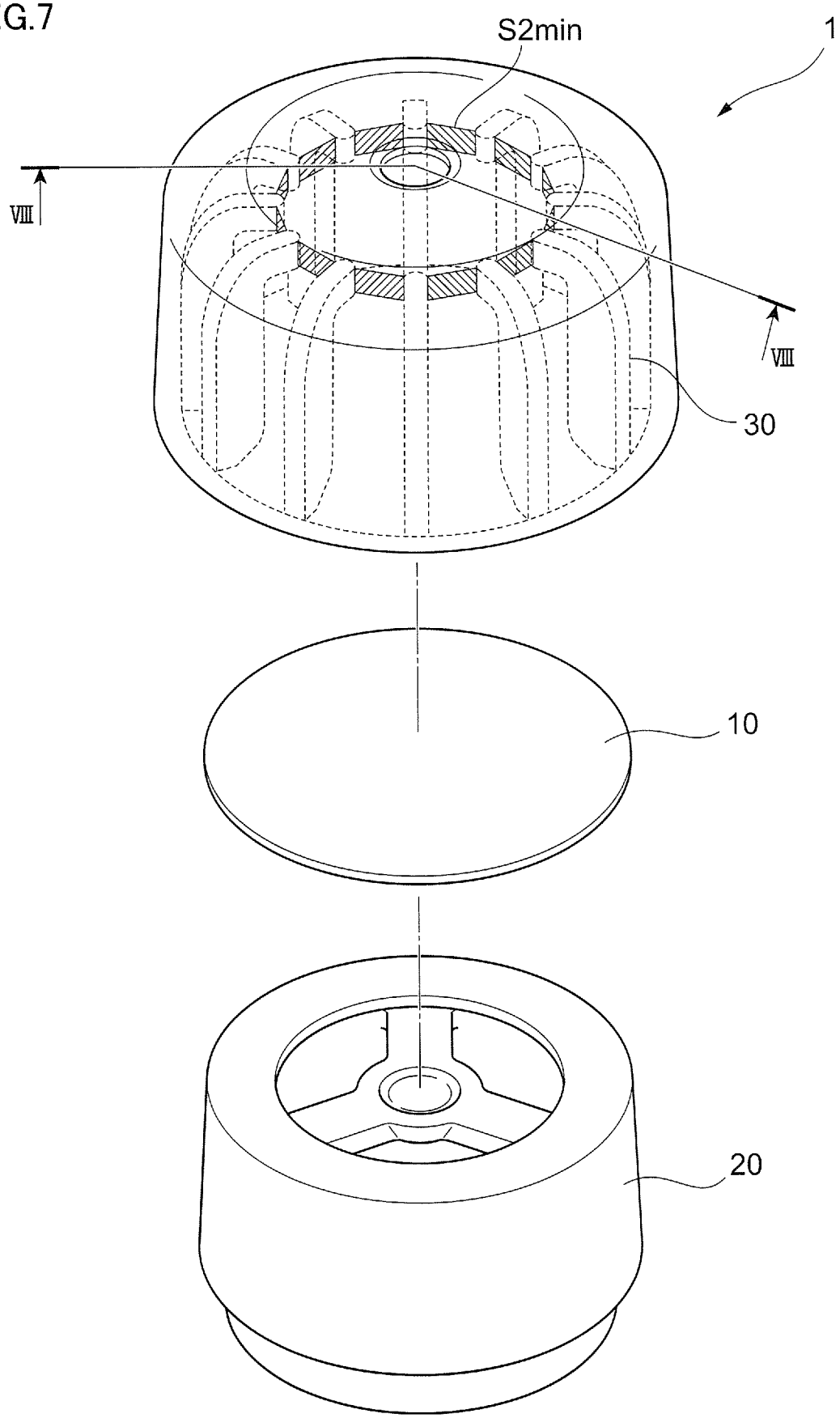

REFERENCE EXAMPLE 7

REFERENCE EXAMPLE 8

REFERENCE EXAMPLE 9

REFERENCE EXAMPLE 10

REFERENCE EXAMPLE 11

VENTILATION HOUSING

TECHNICAL FIELD

The present invention relates to a ventilation housing.

BACKGROUND ART

Conventionally, devices including vehicle lamps, such as head lamps, rear lamps, fog lamps and turn lamps, an inverter, a converter, an ECU (Electronic Control Unit), a battery box and the like require ventilating properties eliminating a differential pressure generated inside a housing due to temperature change. In addition, these devices require dust-proofing properties preventing foreign materials from entering inside a housing, water-resisting properties preventing entry of water, oil repellent properties preventing entry of oil and CCT tolerance preventing entry of salt. Therefore, a ventilation component provided with functions of the ventilating properties, the dust-proofing properties, the water-resisting properties, the oil repellent properties and the CCT tolerance is attached to each device.

For example, in a ventilation cap (ventilation component) described in Patent Document 1, into a cover part of substantially a bottomed cylindrical shape, a substantial tubular body having substantially a cylindrical shape is fittingly inserted, and, between the inner circumference of the cover part and the outer circumference of the substantial tubular body, or between a bottom surface of the cover part and a bottom portion of the substantial tubular body is formed into a ventilation path, and a top opening part of the substantial tubular body is formed in an attachment part for attaching to an attachment opening of an device housing. The ventilation cap (ventilation component) described in Patent Document 1 is covered with a filter member (ventilation body), a bottom portion opening of the substantial tubular body of which has ventilating properties, and the attachment part (top opening part) of the substantial tubular body is fittingly inserted into the attachment opening formed in a neck portion of the device housing; thereby the ventilation cap is attached to the device housing.

CITATION LIST

Patent Literature

Patent Document 1: Japanese Patent Application Laid-Open Publication No. 2001-143524

SUMMARY OF INVENTION

Technical Problem

Although it is desired to further downsize the ventilation component, as described above, from the viewpoint of space saving and cost reduction, the ventilation component is likely to drop off from the housing as the ventilation component is made smaller.

An object of the present invention is to provide a ventilation housing from which the ventilation component is less likely to drop off.

Solution to Problem

The present invention completed under such a purpose is a ventilation housing including: a housing (100); and a ventilation component (1); the housing (100) including a tubular projecting part (110) protruded from the housing (100), the projecting part (110) including a communicating hole (111) formed therein to communicate inner space and outer space of the housing (100), the ventilation component (1) including: a tubular attachment member (20) made of an elastic body, the attachment member (20) being press-fitted over the projecting part (110) to be attached thereon so as to bring an inner surface (21c) of the attachment member (20) into contact with an outer surface (112) of the projecting part (110); a ventilation body (10) supported by the attachment member (20) to cover an end portion of the communicating hole (111) with the attachment member (20), and providing ventilation between the inner space and the outer space; and a covering member (30) including a peripheral part (31, 32) disposed around an outer surface (22a) of the attachment member (20) and a top part (33) covering the ventilation body (10) with the peripheral part (31, 32), the covering member (30) being press-fitted over the attachment member (20) so as to bring an inner surface (32a) of the peripheral part (31, 32) into contact with the outer surface (22a), at least one selected from an interior of the attachment member (20), an interior of the covering member (30), and a gap between the outer surface (22a) of the attachment member (20) and the peripheral part (31, 32) of the covering member (30) including at least one ventilation path connecting the ventilation body (10) and the outer space, and a first contact part (11) positioning closer to the inner space than an end portion (110a) on the outer space side in a second contact part (12), the first contact part (11) being a contact portion between an outermost protruding portion protruding from the outer surface (22a) of the attachment member (20) and the inner surface (32a) of the peripheral part (31, 32) of the covering member (30), and the second contact part (12) being a contact portion between the outer surface (112) of the projecting part (110) of the housing (100) and the inner surface (21c) of the attachment member (20).

Here, the outer surface of the attachment member (20) may be inclined to gradually protrude outward of the outer surface with a move toward the outer space.

Moreover, a distance in a hole direction of the communicating hole (111) in the second contact part (12) may be 5 mm to 8 mm, and a distance in the hole direction between the first contact part (11) and the end portion on the outer space side in the second contact part (12) may be 0.5 mm to 6 mm.

Moreover, the attachment member (20) may include an intervention part (23) between a portion (21c) forming the second contact part (12) with the projecting part (110) and a portion (21a) supporting the ventilation body (10).

Moreover, the peripheral part (31, 32) of the covering member (30) may include a tubular side wall part (31) and inward protruding parts protruding from an inner surface (31a) of the side wall part (31), inside surfaces (32a) of the inward protruding parts (32) serving as the inner surface (32a) forming the first contact part (11) with the outer surface (22a) of the attachment member (20), and the number of the inward protruding parts (32) may be 6 to 16, the inward protruding parts (32) being disposed at regular intervals in a circumferential direction of the outer surface (22a) of the attachment member (20).

Moreover, the attachment member (20) may be made of an elastic body containing a thermoplastic resin or a thermosetting resin, and a convex-shaped gate projection, or a gate remainder and residue after removal thereof may exist on a side surface of the attachment member (20), the gate projection arising from a gate (53) for filling a mold used for manufacturing the attachment member (20) with a thermoplastic material or a thermosetting material.

Moreover, a height (H1) from one end portion to the other end portion of the attachment member (20) may be 6 mm or more and 10 mm or less.

Moreover, when observed from a direction perpendicular to a center axis of the ventilation component (1), a length (L1) of a portion in the attachment member (20) in a direction along the center axis covered with the peripheral part (31, 32) of the covering member (30) may be 6.0 mm or more and 8.0 mm or less.

Moreover, at least one of the covering member (30) and the attachment member (20) may include a locking mechanism detachably joining the covering member (30) and the attachment member (20).

Moreover, a ratio S2 min/S1 may be 1.0 or more, S1 being a cross-sectional area of the communicating hole (111) cut by a plane perpendicular to a center axis of the projecting part (110), and S2 min being a total area at positions where the total area, which is a sum of cross-sectional areas of the ventilation paths cut by planes perpendicular to each ventilating direction at each distance from the ventilation body (10), becomes smallest.

Moreover, a ratio $S2_{out}/S1$ may be 1.0 or more, S1 being a cross-sectional area of the communicating hole cut by a plane perpendicular to a center axis of the projecting part (110), and $S2_{out}$ being a total area of planes representing cross sections at positions where the ventilation paths become narrowest when the ventilation paths are observed from the inner space side along a center axis of the ventilation component.

Note that the above signs in this section are provided for exemplification in describing the present invention, and the present invention is not restricted by these signs.

Advantageous Effects of Invention

According to the present invention, it is possible to provide a ventilation housing from which the ventilation component is less likely to drop off.

BRIEF DESCRIPTION OF DRAWINGS

FIG. 4A shows the case of the four inward protruding parts, FIG. 4B shows the case of the six inward protruding parts, and FIG. 4C shows the case of the twelve inward protruding parts;

FIG. 7 shows a specific example of a configuration of the ventilation component;

FIGS. 15A-1 and 15A-2 show the procedures of creating an image of planes indicating positions of the narrowest ventilation paths from a photograph of the ventilation component taken from the bottom surface side by using binarization processing, and FIGS. 15B-1 to 15B-5 are images of planes each indicating positions of the narrowest ventilation paths obtained with respect to Reference examples 7 to 11, respectively;

DESCRIPTION OF EMBODIMENTS

Hereinafter, an exemplary embodiment according to the present invention will be described in detail with reference to attached drawings.

Figure 1:
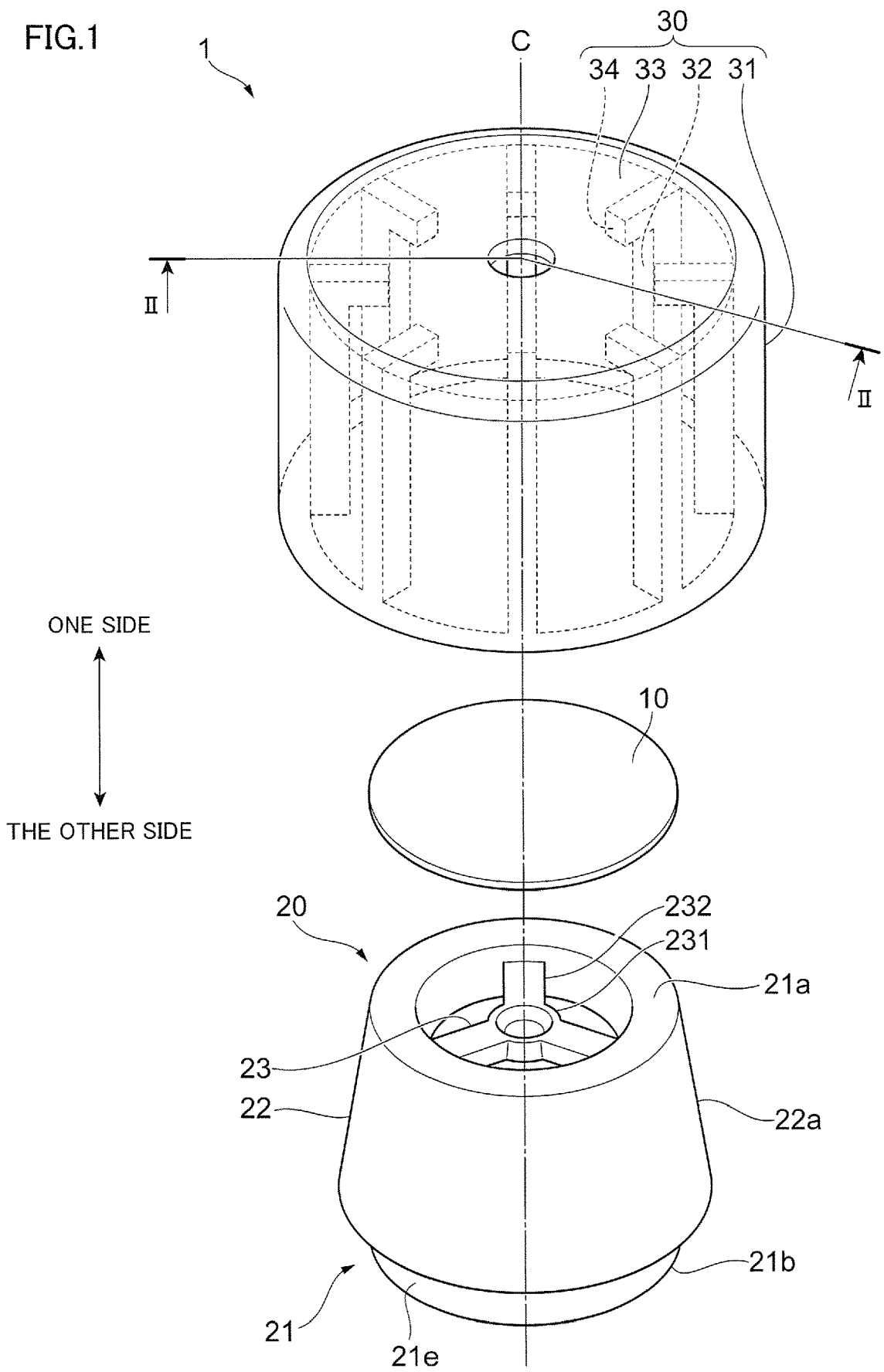
FIG. 1 shows a general configuration of a ventilation component related to an exemplary embodiment.

FIG. 1 shows a general configuration of a ventilation component 1 related to the exemplary embodiment.

Figure 2:
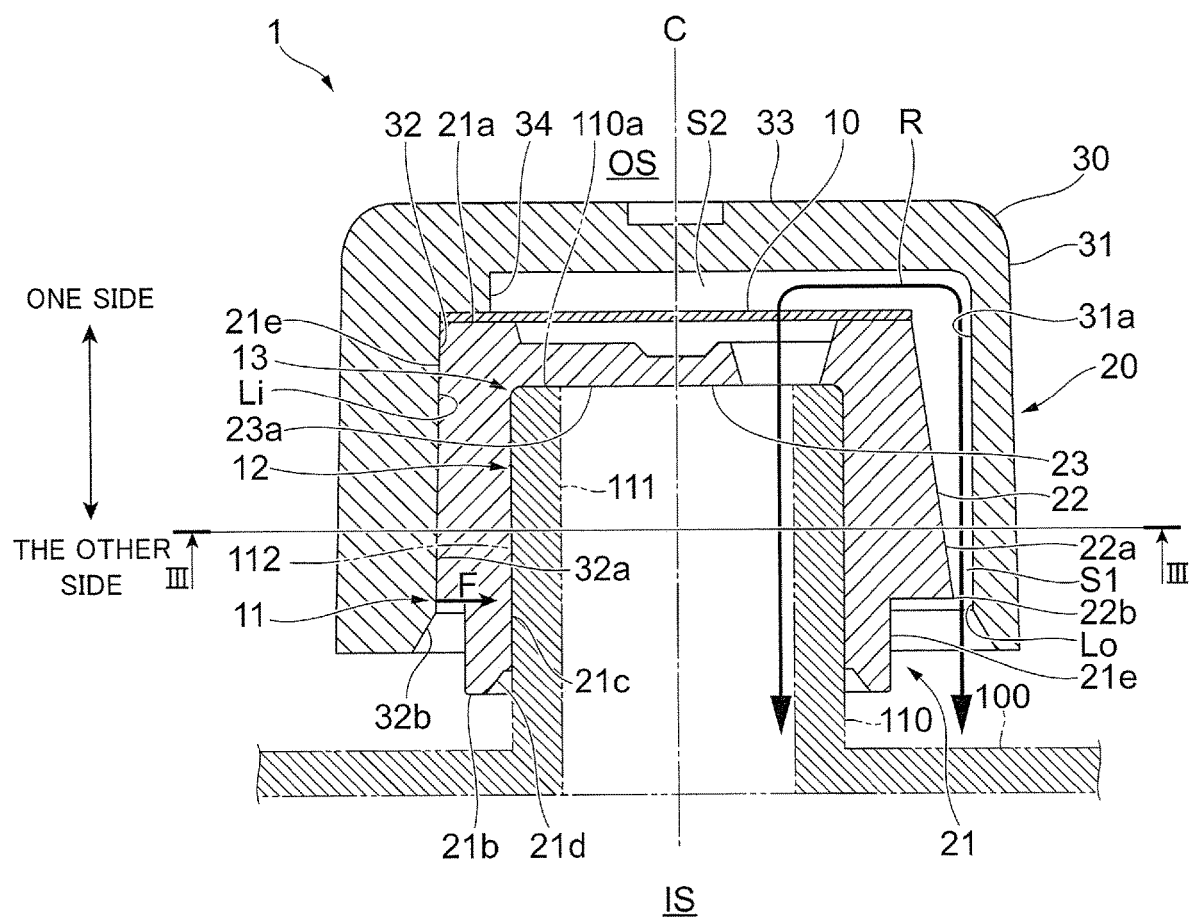
FIG. 2 is a cross-sectional view of the ventilation component related to the exemplary embodiment, which is a cross-sectional view of the II-II portion in FIG. 1.

FIG. 2 is a cross-sectional view of the ventilation component 1 related to the exemplary embodiment, which is a cross-sectional view of the II-II portion in FIG. 1.

Figure 3:
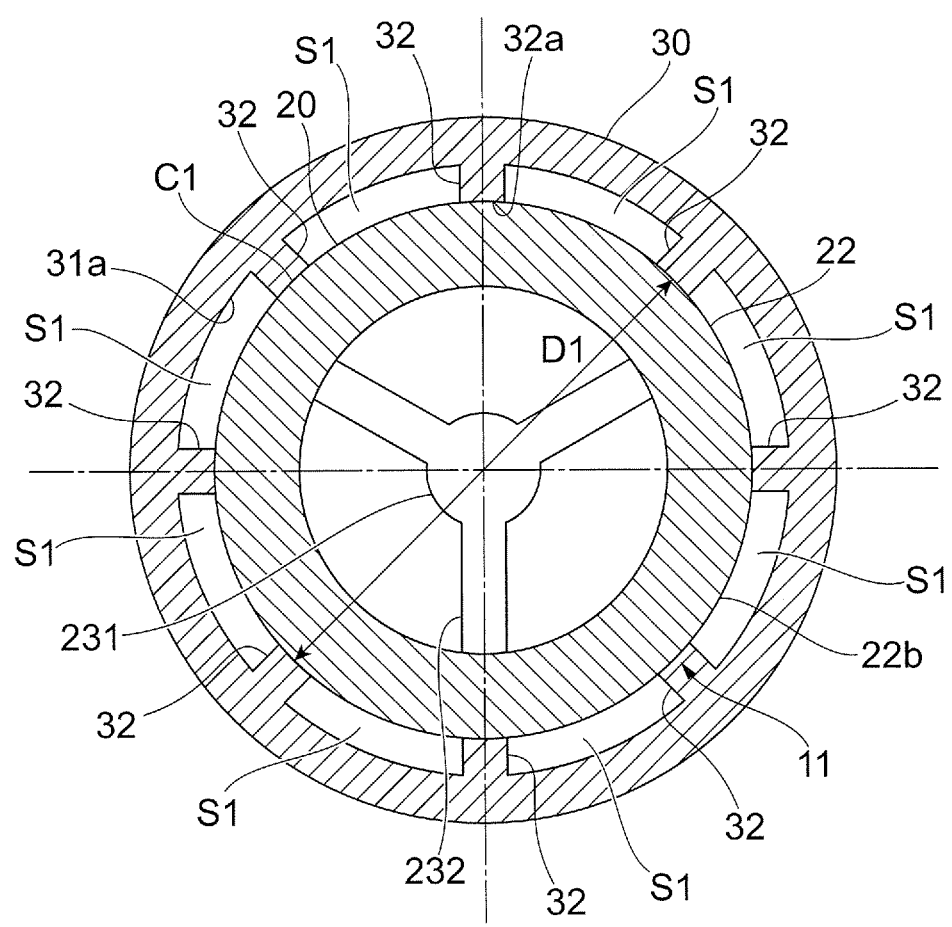
FIG. 3 is a cross-sectional view of the III-III portion in FIG. 2.

FIG. 3 is a cross-sectional view of the III-III portion in FIG. 2.

The ventilation component 1 is attached to a device housing 100, as a specific example of a housing, of devices including vehicle lamps, such as head lamps, rear lamps, fog lamps and turn lamps, an inverter, a converter, an ECU (Electronic Control Unit), a battery box and the like. FIG. 2 shows an attached part 110 by chain double-dashed lines, the attached part 110, as a specific example of a tubular projecting part protruding from the device housing 100, being a portion provided in the device housing 100 for attaching the ventilation component 1. The interior of the attached part 110 functions as a communicating hole 111 communicating the inner space IS and the outer space OS of the device housing 100.

The ventilation component 1 includes a ventilation membrane 10, as a specific example of a ventilation body having holes formed therein that prevent fluid or solids from penetrating into the inside of the device housing 100 from the outside of the device housing 100 and permit flow of gas between the inside of the device housing 100 and the outside of the device housing 100.

In addition, the ventilation component 1 includes an attachment member 20 made of an elastic body and supporting the ventilation membrane 10, and a covering member 30 covering the periphery of the ventilation membrane 10.

«Ventilation Membrane 10»

The ventilation membrane 10 is formed into a disk shape. The outer diameter of the ventilation membrane 10 is larger than the diameter of an inner circumferential surface 21c, which will be described later, of the attachment member 20. The outer diameter of the ventilation membrane 10 may be larger than the diameter of an inner surface 32a of an inward protruding part 32, which will be described later, of the covering member 30.

The structure or material of the ventilation membrane 10 is not particularly limited as long as the ventilation membrane 10 allows passage of gas and prevents passage of a liquid. Specific examples of the ventilation membrane 10 can include cloth, resin or metal in a mesh shape or a fiber shape. For example, the ventilation membrane 10 can be a woven cloth, a non-woven cloth, a resin mesh, a net, a sponge, a porous metal body or a metal mesh.

The ventilation membrane 10 related to the exemplary embodiment includes a reinforcing layer laminated on a resin porous membrane for providing high strength to the ventilation membrane 10.

As the material of the resin porous membrane, specific examples can include a fluorine resin porous body or a polyolefine porous body that can be manufactured by a known stretching method or extraction method. As the fluorine resin, specific examples can include PTFE (polytetrafluoroethylene), polychlorotrifluoroethylene, tetrafluoroethylene-hexafluoropropylene copolymer and tetrafluoroethylene-ethylene copolymer. As monomers constituting polyolefine, specific examples can include: ethylene; propylene; 4-methylpentene-1; and 1-butene, and polyolefine obtained by homopolymerizing or copolymerizing these monomers can be used. Moreover, the material of the resin porous membrane may be obtained by blending at least two kinds of polyolefine, or may be a layer structure of at least two kinds of polyolefine.

In addition, specific examples of the material of the resin porous membrane can include a nanofiber film porous body or the like using polyacrylonitrile, nylon or polylactic acid.

The ventilation membrane 10 related to the exemplary embodiment uses a PTFE porous membrane in view of the fact that a sufficient ventilation amount can be obtained even with a small area and high function of preventing water or dust from penetrating into the inside of the device housing 100 is provided.

Specific examples of the average pore diameter of pores formed in the ventilation membrane 10 can be within the range from 0.01 µm or more to 100 µm or less. Among the range, the average pore diameter is preferably in the range from 0.05 µm or more to 50 µm or less, and more preferably, in the range from 0.1 µm or more to 10 µm or less.

In the case where the average pore diameter formed in the ventilation membrane 10 is less than 0.01 µm, air is less likely to pass through the ventilation membrane 10. On the other hand, in the case where the average pore diameter of the ventilation membrane 10 exceeds 100 µm, fluid or solids are likely to penetrate into the inside of the device housing 100 through the ventilation membrane 10.

The thickness of the ventilation membrane 10 is not particularly limited; however, specific examples of the thickness can be within the range from 10 µm or more to 1000 µm or less.

When the thickness of the ventilation membrane 10 is excessively small, strength of the ventilation membrane 10 is likely to be reduced. On the other hand, when the thickness of the ventilation membrane 10 is excessively large, the size of the ventilation component 1 is likely to be increased.

On the surface of the ventilation membrane 10 (in particular, on an outside portion), liquid repellent treatment, such as water repellent treatment or oil repellent treatment may be applied. Application of the liquid repellent treatment to the ventilating membrane 10 suppresses adhesion of contamination or the like to the ventilation membrane 10. As a result, clogging of the ventilation membrane 10 is suppressed.

The liquid repellent treatment for the ventilation membrane 10 can be performed by coating the surface of the ventilation membrane 10 with a liquid repellent agent, which has, for example, a compound including a hydrocarbon group saturated with fluoride (perfluoro-alkyl group) in a side chain and has a main chain of acrylic series, methacrylic series, silicone series or the like as a component. The method of coating the surface of the ventilation membrane 10 with the liquid repellent agent is not particularly limited; for example, gravure coating, spray coating, kiss coating, dipping or the like can be adopted.

Moreover, as the oil repellent treatment, the method thereof is not particularly limited as long as oil repellent coating containing polymer having perfluoro-alkyl group can be formed. As the forming method, specific examples can include coating of solution or dispersion of polymer having perfluoro-alkyl group by an air spray method, an electrostatic spray method, a dip coating method, a spin coating method, a curtain coating method, an impregnation method or the like, or coating formation method or the like by an electrodeposition coating method or a plasma polymerization method.

«Attachment Member 20»

The attachment member 20 is a tubular, elastic body made of an elastic material, and is a specific example of an attachment member or an internal member.

The attachment member 20 includes: a cylindrical part 21 in a cylinder shape; an outward protruding part 22 outwardly protruding from the cylindrical part 21; and a coupling part 23, as a specific example of an intervention part coupling one portion and another portion in an inner surface of the cylindrical part 21.

The attachment member 20 supports the ventilation membrane 10 at one end portion 21a in the cylindrical part 21 in the direction of the centerline C (hereinafter, referred to as "centerline direction" in some cases). In other words, the ventilation membrane 10 is supported by the attachment member 20 to cover an opening in the cylindrical part 21 on one side in the centerline direction (the upper side in FIG. 1). The method for fastening the ventilation membrane 10 to the cylindrical part 21 will be described in detail later.

The diameter of the inner circumferential surface 21c of the cylindrical part 21 is set smaller than the diameter of the outer circumferential surface 112 of the attached part 110 of the device housing 100. Therefore, the attachment member 20 is attached to the device housing 100 by fitting the cylindrical part 21 over the outer circumferential surface 112 of the attached part 110 of the device housing 100 in a close-fit state (press-fitting). In other words, the attachment member 20 is attached to the attached part 110 by press fitting so that the inner circumferential surface 21c, as a specific example of an inner surface, of the cylindrical part 21 is brought into contact with the outer circumferential surface 112, as a specific example of an outer surface, of the attached part 110 of the device housing 100. Since the attachment member 20 is the elastic body, in the state where the attachment member 20 is attached to the attached part 110, the diameter of the inner circumferential surface 21c of the cylindrical part 21 is larger than before the attachment, and a contact pressure is generated between the inner circumference surface 21c of the cylindrical part 21 and the outer circumference surface 112 of the attached part 110. The contact pressure prevents the attachment member 20 from falling out of the attached part 110. At the inside portion on the other end portion 21b side of the cylindrical part 21, a chamfer 21d is formed. By the chamfer 21d, the attached part 110 of the device housing 100 is inserted into the inside of the cylindrical part 21 with ease.

Specific examples of the thickness of the cylindrical part 21 can be 0.5 mm to 3.0 mm. More preferably, specific examples of the thickness of the cylindrical part 21 can be 2.0 mm or less. If it is possible to fit the attachment member 20 over the attached part 110 of the device housing 100 in the close-fit state to suppress fallout by the contact pressure generated between the inner circumferential surface 21c and the outer circumferential surface 112 of the attached part 110 of the device housing 100 and it is also possible to suppress the rupture, it is preferable that the thickness of the cylindrical part 21 is small. This is because the weight and size of the attachment member 20 can be reduced.

Note that, if the contact pressure is generated between the inner circumference surface 21c of the cylindrical part 21 and the outer circumference surface 112 of the attached part 110 with the attachment member 20 being attached to the outside of the attached part 110 of the device housing 100, the attachment member 20 is not limited to the cylindrical shape. When the attachment member 20 is press-fitted over the cylindrical attached part 110, the cylinder-shaped attachment member 20 causes the inner circumferential surface 21c of the cylindrical part 21 and the outer circumferential surface 112 of the attached part 110 to be brought into contact with each other over whole circumference, to thereby increase the contact area; however, if the contact pressure is generated between the inner circumferential surface 21c of the cylindrical part 21 and the outer circumferential surface 112 of the attached part 110, the contact therebetween may be partial. For example, the attachment member 20 may have the cylindrical shape with the shape of the inner surface in the direction of the centerline of the cylinder being an ellipse or a polygon, such as a rectangle or a hexagon. Similarly, the attached part 110 of the device housing 100 is not limited to the cylindrical shape; the attached part 110 may have the cylindrical shape with the shape of the outer surface in the direction of the centerline of the cylinder being an ellipse or a polygon, such as a rectangle or a hexagon.

The outward protruding part 22 outwardly protrudes from the outer circumferential surface 21e of the cylindrical part 21. The outward protruding part 22 is provided from an end portion on one side to the other end in the centerline direction in the cylindrical part 21 over whole circumference of the cylindrical part 21. The outer circumferential surface 22a, as a specific example of an outer surface of the outward protruding part 22 gradually bulges outwardly with a move from one side to the other side in the centerline direction. In other words, the outer circumferential surface 22a of the outward protruding part 22 is gradually inclined away from the communicating hole 111 with a move from the outer space OS side to the inner space IS side in the hole direction of the communicating hole 111. More specifically, as shown in FIG. 2, in the case where the outward protruding part 22 is cut by a plane including the centerline C, the straight line Li depicting the outer circumferential surface 22a of the outward protruding part 22 is inclined with respect to the centerline C, and the distance between the straight line Li and the centerline C is increased with a move from one side to the other side in the centerline direction.

Note that the outer circumferential surface 22a of the outward protruding part 22 may outwardly bulge in a stepwise manner with a move from one side to the other side in the centerline direction.

In addition, the diameter of the lowermost part of the outer circumferential surface 22a of the outward protruding part 22 does not have to be the maximum, and the diameter between the uppermost part and the lowermost part may be the maximum.

Specific examples of the thickness of the outward protruding part 22 can be set so that the total thickness including the thickness of the cylindrical part 21 ranges from 1.0 mm to 3.5 mm. More preferably, specific examples of the total thickness including the thicknesses of the cylindrical part 21 and the outward protruding part 22 can be 2.5 mm or less.

The coupling part 23 includes: a columnar-shaped center part 231 provided on the centerline C in the cylindrical part 21; and plate-like parts 232 in the plate shape extending from the center part 231 toward the inner circumferential surface 21c of the cylindrical part 21. The coupling part 23 related to the exemplary embodiment includes three plate-like parts 232 extending in three directions from the center part 231. The three plate-like parts 232 are formed at regular intervals (120-degree intervals) in the circumferential direction. Note that the number of the plate-like parts 232 is not limited to three.

The coupling part 23 is provided at a position closer to one end portion 21a than the other end portion 21b in the centerline direction of the cylindrical part 21. Moreover, it can be illustrated, as a specific example, that the distance in the centerline direction between the ventilation membrane 10 supported by the one end portion 21a of the cylindrical part 21 and the coupling part 23 can be smaller than the radius of the inner circumferential surface 21c of the cylindrical part 21. With this configuration, the coupling part 23 suppresses deformation of the ventilation membrane 10.

The material of the attachment member 20 is the thermoplastic material or the thermosetting material. As the thermoplastic material, specific examples include polybutylene terephthalate (PBT), polyphenylene sulfide (PPS), polysulfone (PS), polypropylene (PP), polyethylene (PE), ABS resin, thermoplastic elastomer and a composite material thereof. Moreover, as the thermosetting material, specific examples include synthetic rubber, such as NBR (nitrile-butadiene rubber), EPDM (ethylene-propylene-diene-methylene (rubber)), silicone rubber, fluororubber, acrylic rubber and nitrile-butadiene rubber hydride, and a composite material thereof. Note that, as the material of the attachment member 20, other than the above-described thermoplastic material or thermosetting material, a composite material made by combining a reinforcement, such as glass fiber or carbon fiber, or metal with the thermoplastic material or thermosetting material to improve heat resistance, dimensional stability, rigidity or the like may be used.

The manufacturing method of the attachment member 20 will be described in detail later.

On the surface of the attachment member 20 (in particular, to an outside portion thereof), liquid repellent treatment, such as water repellent treatment or oil repellent treatment may be applied. By applying the liquid repellent treatment to the attachment member 20, adhesion of contamination or the like to the attachment member 20 is suppressed. As a result, clogging of the ventilation membrane 10 can be suppressed. It can be illustrated, as a specific example, that the liquid repellent treatment or oil repellent treatment for the attachment member 20 are the same as the above-described liquid repellent treatment or oil repellent treatment for the ventilation membrane 10.

As a method for fastening the ventilation membrane 10 to the attachment member 20, in the case where the attachment member 20 is made of the thermoplastic material, thermal welding, such as iron welding, ultrasonic welding or laser welding, is preferred. In addition, the ventilation membrane 10 may be fastened to the attachment member 20 by use of insert molding that injects resin in the state in which the ventilation membrane 10 is set to a mold.

When the attachment member 20 is attached to the attached part 110 of the device housing 100, the attachment member 20 is press-fitted until the end surface 23a on the other side of the coupling part 23 collides with the tip end portion 110a of the attached part 110. In other words, the inner circumferential surface 21c of the cylindrical part 21 of the attachment member 20 is brought into contact with the outer circumferential surface 112 of the cylinder-shaped attached part 110, and the end surface 23a on the other side of the coupling part 23 is brought into contact with the tip end portion 110a of the attached part 110. The tip end portion 110a of the attached part 110 serves as an end portion on the outer space OS side in the contact portion between the inner circumferential surface 21c of the attachment member 20 and the outer circumferential surface 112 of the attached part 110. Since the end surface 23a on the other side of the coupling part 23 and the tip end portion 110a of the attached part 110 are in contact with each other, the end surface 23a on the other side of the coupling part 23 also serves as the end portion on the outer space OS side in the contact portion between the inner circumferential surface 21c of the attachment member 20 and the outer circumferential surface 112 of the attached part 110.

In the ventilation component 1 related to the exemplary embodiment, a specific example of the diameter of the inner circumferential surface 21c of the cylindrical part 21 in the attachment member 20 can be 7.5 mm, and specific examples of the distance in the centerline direction in the contact portion between the inner circumferential surface 21c and the outer circumferential surface 112 of the attached part 110 of the device housing 100 can be 5 mm to 8 mm.

As described above, the attachment member 20 is a specific example of an attachment member, which is a cylinder-shaped elastic body, to be attached to the attached part 110 by press fitting so that the inner circumferential surface 21c is brought into contact with the outer circumferential surface 112 of the attached part 110 of the device housing 100.

Note that the attachment member in the present invention is "a tubular elastic body to be attached to a tubular projecting part protruded from a housing by press fitting so that an inner surface of the attachment member is brought into contact with an outer surface of the projecting part with a communicating hole formed therein to provide communication between the inner space and the outer space of the housing," but the attachment member does not have to be a single component, and may be configured with two components or more. The attachment member 20 is a single component formed by integrating the cylindrical part 21 and the coupling part 23; however, for example, the attachment member 20 may be configured with two components, the cylindrical part 21 and the coupling part 23 that have been separated.

«Covering Member 30»

The covering member 30 includes: a side wall part 31 having a cylindrical basic shape; plural inward protruding parts 32 inwardly protruding from an inner circumferential surface 31a of the side wall part 31; and disk-shaped top part 33 covering an opening portion on one side in the centerline direction in the side wall part 31; and an other-side protruding part 34 protruding toward the other side in the centerline direction from the top part 33. In FIG. 2, the cross-sectional shape of the side wall part 31 and the top part 33 is depicted on the right side of the centerline C, and the cross-sectional shape of the side wall part 31, the inward protruding part 32, the top part 33 and the other-side protruding part 34 is depicted on the left side of the centerline C.

The side wall part 31 is formed to generate a gap S1 between the inner circumferential surface 31a of the side wall part 31 and the outer circumferential surface 22a of the outward protruding part 22 of the attachment member 20.

As shown in FIG. 3, the plural (in the exemplary embodiment, eight) inward protruding parts 32 are formed at regular intervals in the circumferential direction.

In the case where the inward protruding parts 32 are cut by a plane perpendicular to the centerline C, as shown in FIG. 3, inner surfaces 32a of the plural (eight in the exemplary embodiment) inward protruding parts 32 are formed on substantially the same circle C1. Moreover, the inner surface 32a of the inward protruding part 32 is gradually tilted inward (toward the centerline C side) with a move from one side to the other side in the centerline direction. More specifically, as shown in FIG. 2, in the case where the inward protruding part 32 is cut by a plane including the centerline C, the straight line Lo depicting the inner surface 32a of the inward protruding part 32 is inclined with respect to the centerline C, and the distance between the straight line Lo and the centerline C is reduced with a move from one side to the other side in the centerline direction. To put it another way, the diameter D1 of the above-described circle C1 is gradually reduced with a move from one side to the other side in the centerline direction.

Note that the inner surface 32a of the inward protruding part 32 is inclined inwardly (toward the centerline C side) in a stepwise manner with a move from one side to the other side in the centerline direction.

The diameter D1 of the circle C1 at the inner surface 32a of each of the plural inward protruding parts 32 is set to be smaller than the diameter of an end portion 22b on the other side of the outer circumferential surface 22a of the outward protruding part 22 of the attachment member 20 in the state where the attachment member 20 is not attached to the attached part 110 of the device housing 100, and the covering member 30 is press-fitted over the attachment member 20. Note that the diameter D1 of the circle C1 at the inner surface 32a of each of the plural inward protruding parts 32 may be set larger than the diameter of the outer circumferential surface 22a of the outward protruding part 22 in the state where the attachment member 20 is not attached to the attached part 110 of the device housing 100, and smaller than the diameter of the outer circumferential surface 22a in the state where the attachment member 20 is attached to the attached part 110.

In the exemplary embodiment, the diameter D1 of the circle C1 at the inner surface 32a of the inward protruding part 32 and the diameter of the outer circumferential surface 22a of the outward protruding part 22 are set so that, in the state where the attachment member 20 is attached to the attached part 110, the inner surface 32a of the inward protruding part 32 of the covering member 30 and the outer circumferential surface 22a of the outward protruding part 22 of the attachment member 20 are brought into contact with each other over the whole area in the centerline direction. However, the diameter D1 of the circle C1 at the inner surface 32a of the inward protruding part 32 and the diameter of the outer circumferential surface 22a of the outward protruding part 22 may be set so that the inner surface 32a of the inward protruding part 32 of the covering member 30 is partially brought into contact with the outer circumferential surface 22a of the outward protruding part 22 of the attachment member 20. In such a case, the inner surface 32a of the inward protruding part 32 of the covering member 30 may be set not to contact the upper portion in the outer circumferential surface 22a of the outward protruding part 22 of the attachment member 20.

Moreover, at a portion inside the end portion on the other side in the centerline direction of the inward protruding part 32, a chamfer 32b is formed. The chamfer 32b makes it easy to insert the attachment member 20 into the inside of the covering member 30.

As shown in FIG. 1, the plural (in the exemplary embodiment, eight) other-side protruding parts 34 are formed at regular intervals in the circumferential direction. As shown in FIG. 1, specific examples of the other-side protruding parts 34 can be provided at the positions where the inward protruding parts 32 are provided.

As described above, and as shown in FIG. 2, the covering member 30 includes the side wall part 31 and the inward protruding parts 32, as a specific example of a peripheral part disposed around the outer circumferential surface 22a of the outward protruding part 22 of the attachment member 20, and the top part 33, and is press-fitted over the attachment member 20 so that the inner surfaces 32a of the inward protruding parts 32 are brought into contact with the outer circumferential surface 22a of the attachment member 20. At that time, the covering member 30 is attached to the attachment member 20 so that the other-side protruding parts 34 of the covering member 30 collide the end portion 21a on one side of the cylindrical part 21 of the attachment member 20, and thereby, as shown in FIG. 2, the gap S2 is formed between the top part 33 and the ventilation membrane 10.

Then, as shown in FIGS. 2 and 3, in the state where the covering member 30 is attached to the attachment member 20, the gaps S1 and S2 function as ventilation paths R through which gases flow between the inner space IS and the outer space OS of the device housing 100. The gap S1 is formed between the inner circumferential surface 31a of the side wall part 31 of the covering member 30 and the outer circumferential surface 22a of the outward protruding part 22 of the attachment member 20, and is formed between the inward protruding parts 32 adjacent to each other among the plural inward protruding parts 32. The gap S2 is formed between the top part 33 of the covering member 30 and the ventilation membrane 10.

Note that, in the present invention, the ventilation component "includes: a tubular attachment member to be attached to a tubular projecting part protruded from a housing by press fitting so that an inner surface of the attachment member is brought into contact with an outer surface of the projecting part with a communicating hole formed therein to provide communication between the inner space and the outer space of the housing; and a ventilation body supported by the attachment member to cover an end portion of the communicating hole with the attachment member to perform ventilation between the inner space and the outer space," but, since the ventilation component 1 has a structure in which the end portion of the communicating hole 111 forming the only one ventilation path R connecting the inner space IS and the outer space OS of the device housing 100 is covered with the attachment member 20 and the ventilation membrane 10, ventilation between the inner space IS and the outer space OS of the device housing 100 is performed through the ventilation membrane 10.

In the present invention, the covering member "includes a peripheral part disposed around an outer surface of the attachment member and a top part covering the ventilation body with the peripheral part, and is press-fitted over the attachment member so that the inner surface of the peripheral part is brought into contact with the outer surface of the attachment member." The shape of the inner surface of the peripheral part is not particularly limited as long as the contact pressure is generated between the inner surface of the peripheral part and the outer circumferential surface 22a of the attachment member 20 when the covering member 30 is press-fitted over the attachment member 20 so that the inner surface of the peripheral part to be disposed around the outer circumferential surface 22a of the attachment member 20 is brought into contact with the outer circumferential surface 22a. The inner surface may form an arc around the centerline C, or may be a surface intersecting the radial direction. Alternatively, the inner surface may be an arc-like surface with a convex shape on the centerline C side. Since the attachment member 20 is an elastic body, the attachment member 20 is elastically deformed due to press fitting of the inner surface of the peripheral part over the attachment member 20, and thereby the inner surface of the peripheral part and the outer circumferential surface 22a of the attachment member 20 are brought into surface contact.

The vehicle lamps, such as head lamps, rear lamps, fog lamps and turn lamps provided with the ventilation component 1 configured as described above and a closed device housing 100 containing an LED (Light Emitting Diode) emitting light will be considered.

An LED contained in the device housing 100 of a lamp generates heat to get high temperature when being lighted. Consequently, when the LED is lighted, the air in the inner space IS of the device housing 100 of the lamp is warmed and expanded. On the other hand, when the LED is lighted down, heat generation in the LED is stopped; accordingly, the warmed air in the inner space IS of the device housing 100 is cooled and contracted. In this manner, in the case where the air in the inner space IS of the device housing 100 is expanded to increase the pressure in the inner space IS or the air in the inner space IS is contracted to decrease the pressure in the inner space IS, gases flow through the ventilation path R of the ventilation component 1 from the inner space IS of the device housing 100 toward the outside of the lamp, or, from the outside of the lamp toward the inner space IS of the device housing 100. As a result, it is possible to suppress breakage of the device housing 100 and the like due to sudden increase of the pressure in the inner space IS of the device housing 100 or sudden decrease of the pressure in the inner space IS.

In the ventilation component 1 configured as described above, the outer circumferential surface 22a of the outward protruding part 22 of the attachment member 20 and the inner surfaces 32a of the inward protruding parts 32 of the covering member 30 are brought into contact with each other. In addition, in the ventilation component 1, the outer circumferential surface 112 of the attached part 110 in the device housing 100 and the inner circumferential surface 21c of the cylindrical part 21 in the attachment member 20 are brought into contact, to thereby form a second contact part 12. In the ventilation component 1, a first contact part 11 serving as a contact portion between the end portion 22b on the other side in the centerline direction, which is an outermost protruding portion in the outer circumferential surface 22a of the outward protruding part 22, and the inner surfaces 32a of the inward protruding parts 32 of the covering member 30 is positioned closer to the inner space IS than the end surface 23a on the other side of the coupling part 23, which is an end portion on the outer space OS side in the second contact part 12, or the tip end portion 110a of the attached part 110. Note that "an end portion on the outer space side in the second contact part" is assumed to be judged in the state where the attachment member 20 is press-fitted over the projecting part (attached part 110) of the device housing 100 to a maximum extent. By the way, since the attachment member 20 includes the coupling part 23 and the height of the coupling part 23 is lower than that of the attached part 110, the end surface 23a or the tip end portion 110a serves as the second contact part 12.

Consequently, in the first contact part 11, the force F received by the outward protruding part 22 of the attachment member 20 from the covering member 30 acts in the direction in which the contact pressure in the second contact part 12 between the inner circumferential surface 21c of the cylindrical part 21 of the attachment member 20 and the outer circumferential surface 112 of the attached part 110 in the device housing 100 is increased.

As described above, in the ventilation component 1 related to the exemplary embodiment, the force F received by the attachment member 20 from the covering member 30 acts in the direction in which the contact pressure in the press-fitting portion of the attachment member 20 and the device housing 100 between the inner circumferential surface 21c of the cylindrical part 21 of the attachment member 20 and the outer circumferential surface 112 of the attached part 110 is increased. As a result, the ventilation component 1 related to the exemplary embodiment hardly falls out (hardly comes out) of the attached part 110 of the device housing 100, as compared to the configuration in which the force F received by the attachment member 20 from the covering member 30 acts in the direction in which the contact pressure in the press-fitting portion of the attachment member 20 and the device housing 100 between the attachment member 20 and the attached part 110 is reduced.

Therefore, despite the small contact area of the second contact part 12, such that the diameter of the inner circumferential surface 21c of the cylindrical part 21 of the attachment member 20 is 7.5 mm and the distance in the centerline direction in the second contact part 12 is 5 mm to 8 mm, the attachment member 20 hardly falls out of the attached part 110 of the device housing 100.

In the case where the distance in the centerline direction, which is the hole direction of the communicating hole 111 in the second contact part 12 is 5 mm to 8 mm, the distance in the centerline direction between the first contact part 11 and the end portion on the outer space OS side in the second contact part 12 is preferably 0.5 mm to 6 mm. This can further prevent the attachment member 20 from falling out of the attached part 110 of the device housing 100. The distance in the centerline direction between the first contact part 11 and the end portion on the outer space OS side in the second contact part 12 is preferably 1 mm to 5.5 mm, and more preferably, 1.5 mm to 5 mm.

Note that, in the above-described exemplary embodiment, the contact portion, which serves as the first contact part 11, between the inner surfaces 32a of the inward protruding parts 32 of the covering member 30 and the end portion 22b on the other side in the centerline direction in the outer circumferential surface 22a of the outward protruding part 22 of the attachment member 20 is positioned closer to the inner space IS than a contact portion 13, which serves as an end portion on the outer space OS side in the second contact part 12, between the end surface 23a on the other side of the coupling part 23 and the tip end portion 110a of the attached part 110. If the resultant contact pressure acting on the outward protruding part 22 of the attachment member 20 is positioned closer to the inner space IS than the contact portion 13 between the end surface 23a on the other side of the coupling part 23 and the tip end portion 110a of the attached part 110, a partial region of the contact portion between the inward protruding parts 32 of the covering member 30 and the outward protruding part 22 of the attachment member 20 may be positioned closer to the outer space OS than the contact portion 13 between the end surface 23a on the other side of the coupling part 23 and the tip end portion 110a of the attached part 110.

Note that, in the above-described exemplary embodiment, there were eight inward protruding parts 32 in the covering member 30, but the number of inward protruding parts 32 is not limited to eight.

Figure 4A:
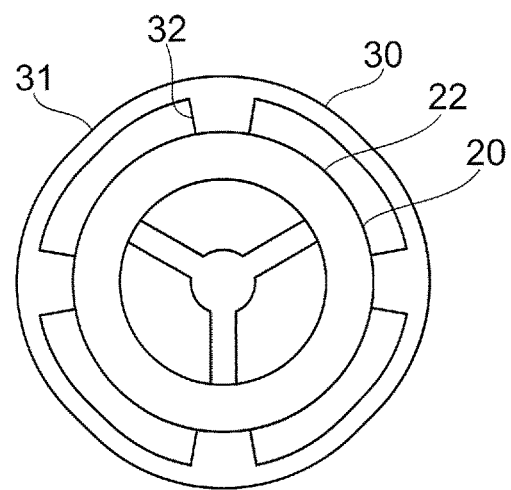
FIGS. 4A to 4C compare deformation of a covering member when the number of inward protruding parts is different, where
Figure 4B:
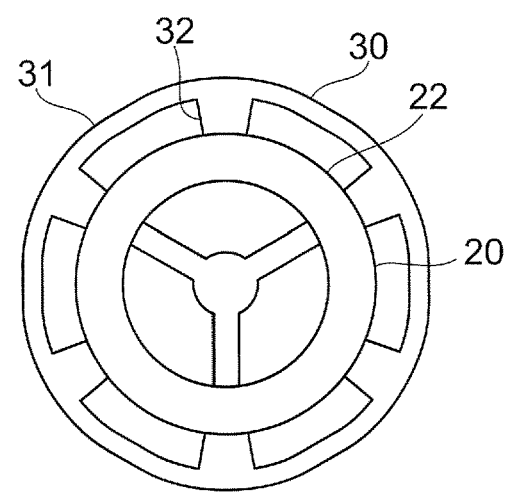
Figure 4C:
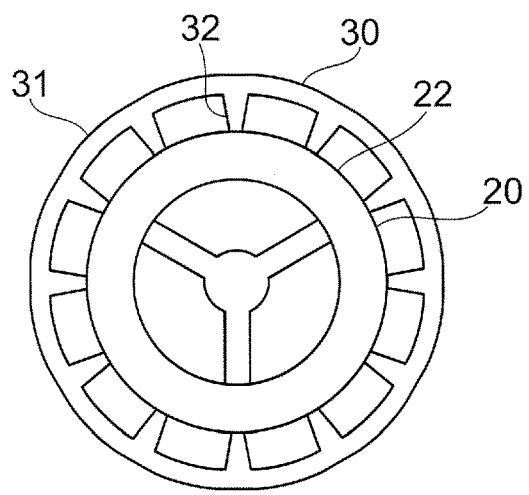

FIGS. 4A to 4C compare deformation of the covering member 30 when the number of inward protruding parts 32 is different.

FIG. 4A shows the deformation of the covering member 30 in the case of the four inward protruding parts 32, FIG. 4B shows the deformation in the case of the six inward protruding parts 32, and FIG. 4C shows the deformation in the case of the twelve inward protruding parts 32.

As shown in FIGS. 4A, 4B, and 4C, in the case where the number of inward protruding parts 32 is four, as compared to the cases where the number of inward protruding parts 32 is more than four, it can be seen that the side wall part 31 between the adjacent inward protruding parts 32 changes linearly. This is considered that, since the distance between the adjacent inward protruding parts 32 is increased as the number of inward protruding parts 32 is reduced, the inward protruding parts 32 are likely to expand outwardly in the radial direction due to the contact pressure with the outward protruding part 22 of the attachment member 20. Therefore, as the number of inward protruding parts 32 is reduced, the contact pressure between the inward protruding parts 32 and the outward protruding part 22 of the attachment member 20 is reduced. As the number of inward protruding parts 32 is increased, the contact pressure is likely to be applied uniformly on the outer circumferential surface 22a of the outward protruding part 22 of the attachment member 20.

Therefore, as the number of inward protruding parts 32 is reduced, the drawing force for the covering member 30 is reduced.

On the other hand, in the case where the total contact areas of the plural inward protruding parts 32 and the outward protruding part 22 of the attachment member 20 are the same, in other words, in the case where the size of the gaps S1 functioning as the ventilation paths R are the same, the size in the circumferential direction (width) in each inward protruding part 32 is reduced as the number of the inward protruding parts 32 is increased; thereby, it becomes difficult to manufacture the covering member 30.

As a result of diligent study by the inventors of the present invention, it was found that the number of inward protruding parts 32 is preferably 6 to 16.

In the ventilation component 1 related to the exemplary embodiment, the attachment member 20 includes the coupling part 23 coupling one portion and another portion in the inner surface of the cylindrical part 21. The coupling part 23 functions as an intervention part between the attached part 110 and the ventilation membrane 10, the coupling part 23 existing between the inner circumferential surface 21c of the cylindrical part 21, which forms the second contact part 12 with the attached part 110 of the device housing 100 and one end portion 21a of the cylindrical part 21, which supports the ventilation membrane 10. Therefore, in the ventilation component 1, when the attachment member 20 is attached to the attached part 110 of the device housing 100, the coupling part 23 prevents the tip end portion 110a of the attached part 110 to be inserted into the cylindrical part 21 of the attachment member 20 from reaching the ventilation membrane 10 supported by the one end portion 21a of the cylindrical part 21. Thus, according to the ventilation component 1 related to the exemplary embodiment, the tip end portion 110a of the attached part 110 is prevented from sticking out through the ventilation membrane 10.

«Method for Manufacturing Attachment Member 20»

Next, a method for manufacturing the attachment member 20 will be described.

Figure 5:
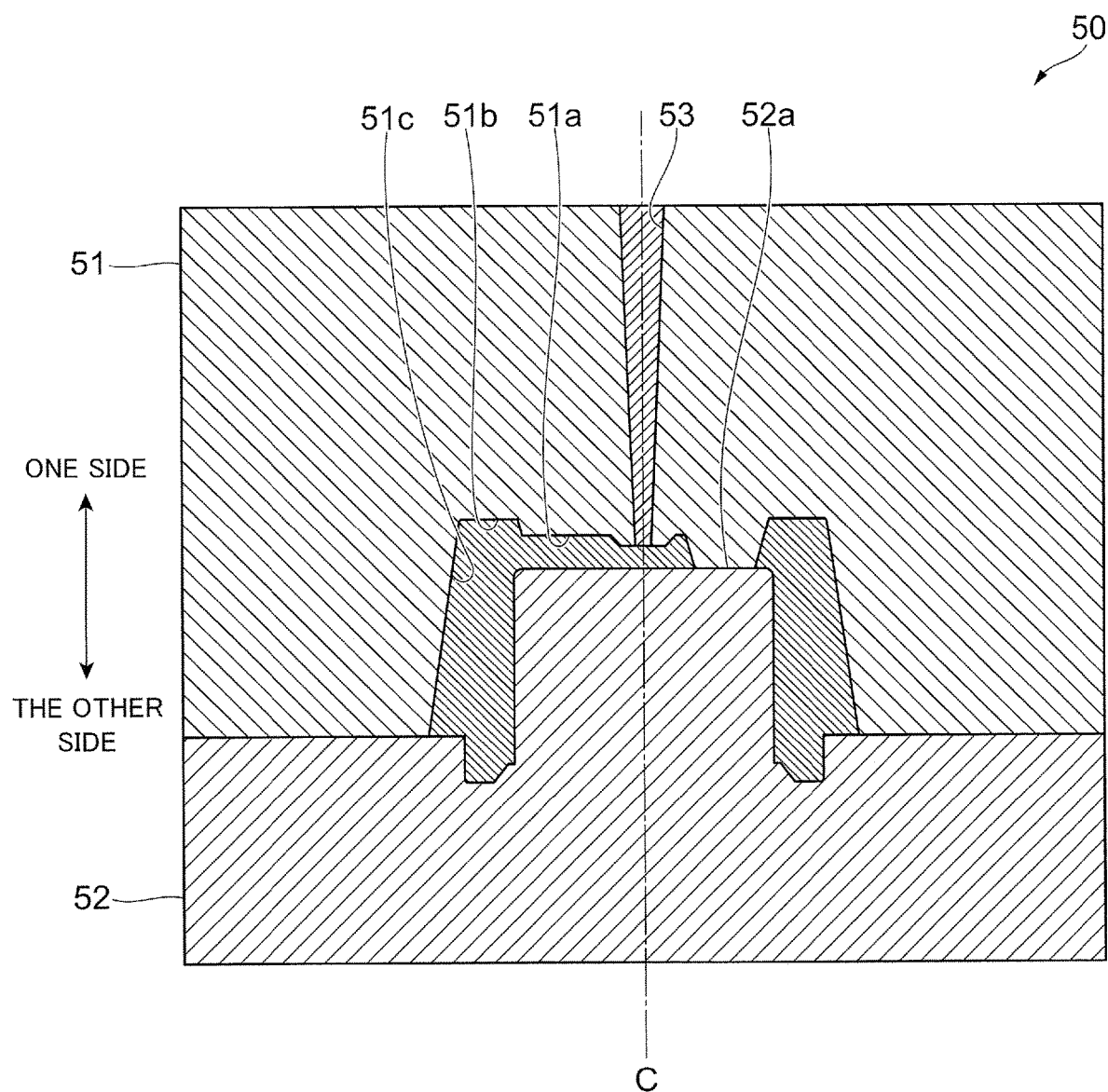
FIG. 5 is a schematic cross-sectional view of a manufacturing device used for manufacturing an attachment member.

FIG. 5 is a schematic cross-sectional view of a manufacturing device 50 used for manufacturing the attachment member 20.

The manufacturing device 50 performs injection molding, and manufactures the attachment member 20 by filling a mold with the thermoplastic material or the thermosetting material (hereinafter, simply referred to as "thermoplastic material, etc." in some cases).

The manufacturing device 50 is provided with: a fixed mold 51; a movable mold 52 moving with respect to the fixed mold 51; and a gate 53 provided to the fixed mold 51 for injecting the thermoplastic material, etc. The moving direction of the movable mold 52 is the same as the centerline direction.

A joint portion of the fixed mold 51 and the movable mold 52 is configured as follows. On the outside of the attachment member 20, the portion is the end portion 22b on the other side in the centerline direction of the outward protruding part 22. On the inside of the attachment member 20, the portion is the end portion on the other side in the centerline direction in the coupling part 23. In other words, on the inside of the attachment member 20, an end surface 52a on one side in the centerline direction in the movable mold 52 is a surface perpendicular to the centerline direction and is formed into a circular shape. On the other hand, in the fixed mold 51, on the end portion on the other side in the centerline direction, a concave portion 51a corresponding to the shape of the coupling part 23, a concave portion 51b corresponding to the shape of the end portion 21a on the one side of the cylindrical part 21, and a concave portion 51c corresponding to the shape of the outward protruding part 22 are formed.

The gate 53 is provided on the centerline C. An injection port of the gate 53 is formed to communicate with the concave portion 51a of the fixed mold 51.

The manufacturing device 50 configured as described above injects the thermoplastic material, etc. into a portion corresponding to the center part 231 of the coupling part 23. The injected thermoplastic material, etc. flows from a portion corresponding to the center part 231 of the coupling part 23 to portions corresponding to the plate-like parts 232, reaches the junction portions with the inner circumferential surface 21c of the cylindrical part 21 from the portions corresponding to the plate-like parts 232, and flows to the portion corresponding to the cylindrical part 21.

In the attachment member 20 manufactured by use of the manufacturing device 50 configured as described above, at the center part 231 of the coupling part 23, a convex-shaped gate projection arising from disposition of the gate 53, or a gate remainder and residue after removal of the gate (hereinafter, these are collectively referred to as "projection arising from the gate" in some cases) are sometimes left; however, no projection arising from the gate is left on the end surface on the other side in the centerline direction (lower end surface) in the cylindrical part 21. Therefore, in the manufacturing line of the ventilation component 1, it becomes possible to run the attachment members 20 in the state of being placed with the lower end surface of the cylindrical part 21 facing down. In other words, the projection arising from the gate does not prevent the attachment member 20 from being placed in the inclined state. Therefore, the productivity of the ventilation component 1 can be improved by using the attachment members 20 manufactured by use of the manufacturing device 50 as configured above. In addition, disposition of the gate 53 at the center part 231 of the coupling part 23 prevents a welding line from being generated in the cylindrical part 21 or the outward protruding part 22; accordingly, even if the attachment member 20 is press-fitted over the attached part 110 for a long time, the attachment member 20 is less likely to be broken or ruptured. As a result, durability of the attachment member 20 can be improved.

<Modified Example of Attachment Member 20>

Figure 6A:
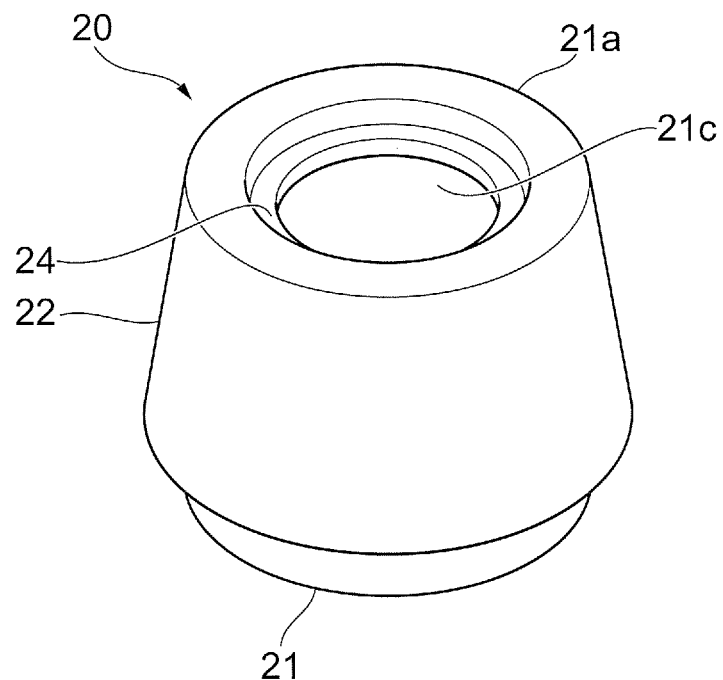
FIG. 6A shows a first modified example of the attachment member.
Figure 6B:
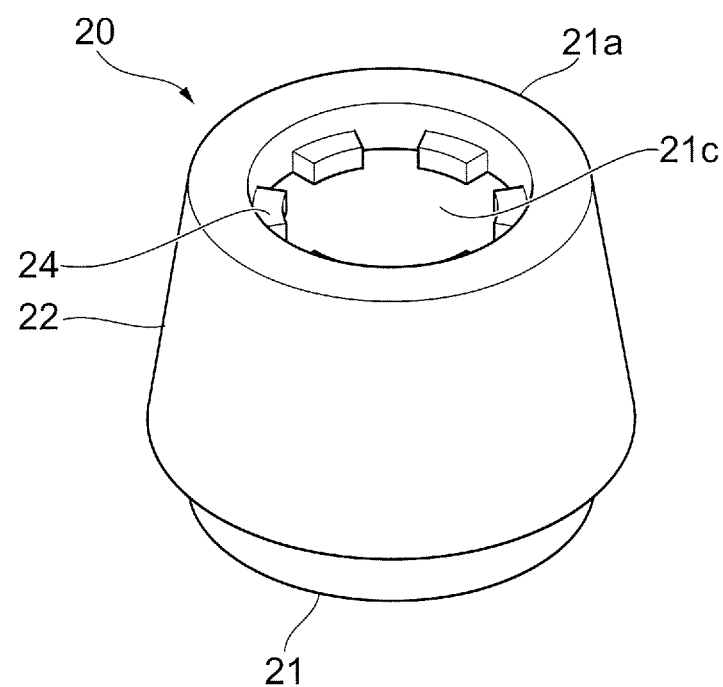
FIG. 6B shows a second modified example of the attachment member.

FIG. 6A shows a first modified example of the attachment member 20, and FIG. 6B shows a second modified example of the attachment member 20. In the modified examples of the attachment member 20, a portion corresponding to the coupling part 23 in the attachment member 20 is different. Hereinafter, the points different from the attachment member 20 in the above-described exemplary embodiment will be described. Among the attachment member 20 related to the above-described exemplary embodiment and the modified examples thereof, the parts having the same shapes and the same functions will be assigned with the same signs, and detailed description thereof will be omitted.

The above-described attachment member 20 includes the coupling part 23 coupling one portion and another portion in the inner circumferential surface 21c of the cylindrical part 21; however, if the coupling part 23 exists between the attached part 110 of the device housing 100 and the ventilation membrane 10, the coupling part 23 is not required to couple the one portion and the other portion in the inner circumferential surface 21c of the cylindrical part 21.

As shown in FIG. 6A, the attachment member 20 may include an inward part 24, which protrudes inward from the inner circumferential surface 21c of the cylindrical part 21, existing between the inner circumferential surface 21c of the cylindrical part 21, which forms the second contact part 12 with the attached part 110 of the device housing 100 and the one end portion 21a of the cylindrical part 21, which supports the ventilation membrane 10. The inward part 24 is a specific example of a first projecting part that protrudes from the inner circumferential surface 21c of the attachment member 20 to face the ventilation membrane 10. By setting the inner diameter of the inward part 24 to a smaller diameter than the diameter of the outer circumferential surface 112 of the attached part 110, the inward part 24 can function as an intervention part between the attached part 110 and the ventilation membrane 10.

However, the inward part 24 does not have to be formed over whole circumference. If the inward part 24 can exist between the attached part 110 and the ventilation membrane 10, the inward part 24 may be formed at a part of the whole circumference. As shown in FIG. 6B, a specific example of the inward part 24 can be six inward parts 24 formed at regular intervals in the circumferential direction.

In the line for manufacturing the ventilation component 1, it is desirable not to leave the projection arising from the gate on the end surface on the other side in the centerline direction (lower end surface) in the cylindrical part 21 for making it possible to run the attachment members 20 related to the first and second modified examples in the state of being placed with the lower end surface of the cylindrical part 21 facing down. For example, the position of the gate 53 is preferably set so that the projection arising from the gate exists on the side surface of the attachment member 20 related to the first and second modified examples. More specifically, the injection port of the gate 53 is preferably set at the outer circumferential surface 22a of the outward protruding part 22 or the outer circumferential surface of the cylindrical part 21. Alternatively, the injection port of the gate 53 is preferably set at the inward part 24 or the inner circumference surface 21c of the cylindrical part 21. In this way, by setting the position of gate 53 to exist on the side surface of the attachment member 20 related to the first and second modified examples, it becomes possible not to leave the projection arising from the gate on the lower end surface of the cylindrical part 21, and thereby it is possible to run the attachment members 20 in the state of being placed with the lower end surface of the cylindrical part 21 facing down. In addition, setting of the injection port of the gate 53 at the inward part 24 prevents the welding line from being generated in the cylindrical part 21 or the outward protruding part 22; accordingly, even if the attachment member 20 is press-fitted over the attached part 110 for a long time, the attachment member 20 is less likely to be broken or ruptured. As a result, durability of the attachment member 20 can be improved.

Note that, in the above-described ventilation component 1, the attachment member 20 includes the cylindrical outward protruding part 22 protruding outwardly from the outer circumferential surface 21e of the cylindrical part 21, and the covering member 30 includes the plural inward protruding parts 32 protruding inwardly from the inner circumference surface 31a of the cylindrical side wall part 31; thereby the gaps S1 functioning as the ventilation paths R are formed between the adjacent inward protruding parts 32. The "ventilation path" is the path through which gases can flow between the ventilation membrane 10 and the outer space OS of the ventilation component 1; for example, the ventilating path means a route of air enabling air passed through the ventilation path 10 from the communicating hole 111 to pass through the gap S1 and finally reach the outer space OS of the ventilation component 1. However, the formation of gaps S1 is not limited to such configurations. For example, the gap between the attachment member 20 and the covering member 30 can serve as the ventilation path R, and space that can be the "ventilation path" may also be formed inside the attachment member 20 or inside the covering member 30. Alternatively, for example, the attachment member 20 includes plural cylindrical partial protruding parts that protrude outward from the outer circumferential surface 21e of the cylindrical part 21, the covering member 30 includes the cylindrical side wall part 31, the top part 33 and the other-side protruding part 34, and has no inward protruding part 32, and then, the covering member 30 is press-fitted over the attachment member 20 so that the inner circumferential surface 31a of the side wall part 31 in the covering member 30 is brought into contact with the outer surfaces of the partial protruding parts in the attachment member 20. In other words, the covering member 30 includes the side wall part 31, as a specific example of the peripheral part disposed around the outer surfaces of the partial protruding parts of the attachment member 20, and the top part 33 covering the ventilation membrane 10 with the side wall part 31, and is press-fitted over the attachment member 20 so that the inner circumferential surface 31a, as a specific example of the inner surface of the side wall part 31, is brought into contact with the outer surfaces of the partial protruding parts of the attachment member 20. Then, between the partial protruding parts adjacent to each other, a gap between the outer circumferential surface 21e of the cylindrical part 21 of the attachment member 20 and the inner circumferential surface 31a of the side wall part 31 of the covering member 30, which functions as the ventilation path R, may be formed. Also, in such a configuration, the contact portion between the inner circumferential surface 31a of the side wall part 31 in the covering member 30 and the outer surfaces of the partial protruding parts in the attachment member 20 is preferably positioned closer to the inner space IS than the end surface 23a on the other side of the coupling part 23, which serves as the end portion on the outer space OS side in the second contact part 12, or the tip end portion 110a of the attached part 110. The force received by the attachment member 20 from the covering member 30 acts in the direction in which the contact pressure between the inner circumferential surface 21c of the cylindrical part 21 in the attachment member 20 and the outer circumferential surface 112 of the attached part 110 of the device housing 100 is increased, and thereby the attachment member 20 becomes less likely to fall out of the attached part 110.

Note that, in the above-described ventilation component 1, the height from one end portion 21a to the other end portion 21b of the attachment member 20 may be, for example, 6.0 mm or more to 10 mm or less. The upper limit of the height may be 9.5 mm or less, 9.0 mm or less, or further, 8.5 mm or less. The lower limit of the height may be 6.5 mm or more, 7.0 mm or more, or further, 7.5 mm or more. Owing to the height falling in these ranges, the device housing 100 exerts moisture permeation performance that is superior to that of the conventional device housing.

In the above-described ventilation component 1, when observed in the direction perpendicular to the centerline C, the length of the portion in the attachment member 20 covered with the inner circumferential surface 31a of the covering member 30 in the direction along the centerline C may be, for example, 3.5 mm or more and 9.5 mm or less, or 6.0 mm or more and 8.0 mm or less. The lower limit of the length may be 4.0 mm or more, 4.5 mm or more, or further, 5.0 mm or more. The upper limit of the length may be 9.0 mm or less, 8.5 mm or less, or further, 8.0 mm or less. If the length is within these ranges, the junction between the attachment member 20 and the covering member 30 is more secure, which makes it difficult to detach the covering member 30 from the attachment member 20. It is also possible to ensure sufficient moisture permeation performance. Note that the above-described length is assumed to be determined based on the state where the covering member 30 is attached as deep as possible to the attachment member 20.

The above-described height of the ventilation component 1 is, for example, 6.0 mm or more and 12 mm or less. The upper limit of the height may be 11 mm or less, 10.5 mm or less, or further, 10 mm or less. The lower limit of the height may be 6.5 mm or more, 7.0 mm or more, or further, 7.5 mm or more. Note that the above-described length is assumed to be determined with reference to the state where the covering member 30 is attached as deep as possible to the attachment member 20.

In the above-described device housing 100, the area S1 of the communicating hole 111 inside the attached part 110, which is cut by a plane perpendicular to the center axis of the attached part 110, may be 5 mm$^2$ or more and 60 mm$^2$ or less. The lower limit of the area S1 may be 10 mm$^2$ or more, 12 mm$^2$ or more, 14 mm$^2$ or more, 16 mm$^2$ or more, or further, 10 mm$^2$ or more. The upper limit of the area S1 may be 50 mm$^2$ or less, 40 mm$^2$ or less, 30 mm$^2$ or less, or further, 20 mm$^2$ or less.

In the above-described device housing 100 and ventilation component 1, the ratio $S2_{min}/S1$ of the cross-sectional area S1 of the communicating hole 111 inside the attached part 110 and the total area $S2_{min}$ at the position where the total area, which is the sum of the cross-sectional areas of the ventilation paths at a distance from the ventilation membrane 10, becomes the smallest is, for example, 0.8 or more. The lower limit of the ratio $S2_{min}/S1$ may be 1.0 or more, 1.1 or more, 1.2 or more, 1.3 or more, or further, 1.4 or more. The upper limit of the ratio $S2_{min}/S1$ is, for example, 3.0 or less, 2.5 or less, or further, 2.0 or less. The ventilation component 1 and the device housing 100 with the ratio $S2_{min}/S1$ within the above ranges are excellent in ventilating property and/or moisture permeation performance. Note that the area S1 is the cross-sectional area of the communicating hole 111 cut by a plane perpendicular to the center axis of the attached part 110. The area S2 min is the total area at the position where the sum of the cross-sectional areas of the ventilation paths cut by a plane perpendicular to each ventilating direction at a distance from the ventilation membrane 10 becomes the smallest. The "ventilation path" is a route through which gases can travel between the ventilation membrane 10 and the outer space OS of the ventilation component 1, and the "ventilating direction" is the direction in which the gas should travel at each position in the ventilation path. Therefore, the ventilating direction is different depending on the position in the ventilation path. In addition, the "total area summed at a distance from the ventilation membrane" means that the sum of the areas of the cross sections of the ventilation paths in the group of positions at the same distance from the ventilation membrane 10 is considered as the total area. Then, the area S2 min represents the total area, from among the total areas, at the position where the area value becomes the smallest, and also represents the total area of the narrowest cross section at the position of the ventilation paths from the ventilation membrane 10 to the outer space OS of the ventilation component 1. Moreover, the area S2 min is assumed to be determined based on the state where the covering member 30 is attached as deep as possible to the attachment member 20.

In the above-described device housing 100 and ventilation component 1, the ratio $S2_{out}/S1$ of the cross-sectional area S1 of the communicating hole 111 inside the attached part 110 and the total area $S2_{out}$ of the planes representing the cross sections at the positions where the ventilation paths become the narrowest when the ventilation paths are observed from the inner space side along the center axis of the ventilation component is, for example, 0.8 or more. The lower limit of the ratio $S2_{out}/S1$ may be 1.0 or more, 1.2 or more, 1.3 or more, 1.5 or more, 1.8 or more, 2.0 or more, or further, 2.2 or more. The upper limit of the ratio $S2_{out}/S1$ is, for example, 4.0 or less, or 3.0 or less. The ventilation component 1 and the device housing 100 with the ratio $S2_{out}/S1$ within the above ranges are excellent in ventilating property and/or moisture permeation performance. The area $S2_{out}$ is the total area of the planes representing the cross sections of the ventilation paths, which can be visually recognized when the ventilation paths are observed from the inner space side along the center axis of the ventilation component, namely, from the lower side, at the positions where the ventilation paths become the narrowest. Moreover, the area $S2_{out}$ is assumed to be determined based on the state where the covering member 30 is attached as deep as possible to the attachment member 20.

In the above-described device housing 100 and ventilation component 1, the ratio of the height of the attachment member 20 to the height of the attached part 110 (the height of the attached part 110/the height of the attachment member 20) may be, for example, 1.00 or more and 1.70 or less. The lower limit of the ratio may be more than 1.00, 1.02 or more, 1.04 or more, 1.06 or more, 1.08 or more, or further, 1.10 or more. The upper limit of the ration may be 1.60 or less, 1.50 or less, 1.40 or less, 1.30 or less, 1.25 or less, 1.22 or less, 1.20 or less, 1.18 or less, 1.16 or less, or further, 1.14 or less. The ventilation component 1 and the device housing 100 with the ratio within the above ranges are excellent in ventilating property and/or moisture permeation performance, and the ventilation component 1 becomes less likely to detach from the device housing 100. Note that the ventilation component 1 is used by attaching the attachment member 20 to the attached part 110 from the end portion of the attachment member 20 on the other side, and the above-described ratio is assumed to be determined based on the state being attached to the attached part 110 as deep as possible.

In the above-described device housing 100 and ventilation component 1, the attachment member 20 and/or the covering member 30 may include a locking mechanism that detachably joins the attachment member 20 and the covering member 30. The locking mechanism can be configured with, for example, a claw part, a threading part, or a fitting part.

EXAMPLES

Subsequently, the present invention will be described specifically based on examples. However, the present invention is not limited to the following examples.

<Moisture Permeability Test 1 for Ventilation Component 1>

Reference Example 1

Figure 8:
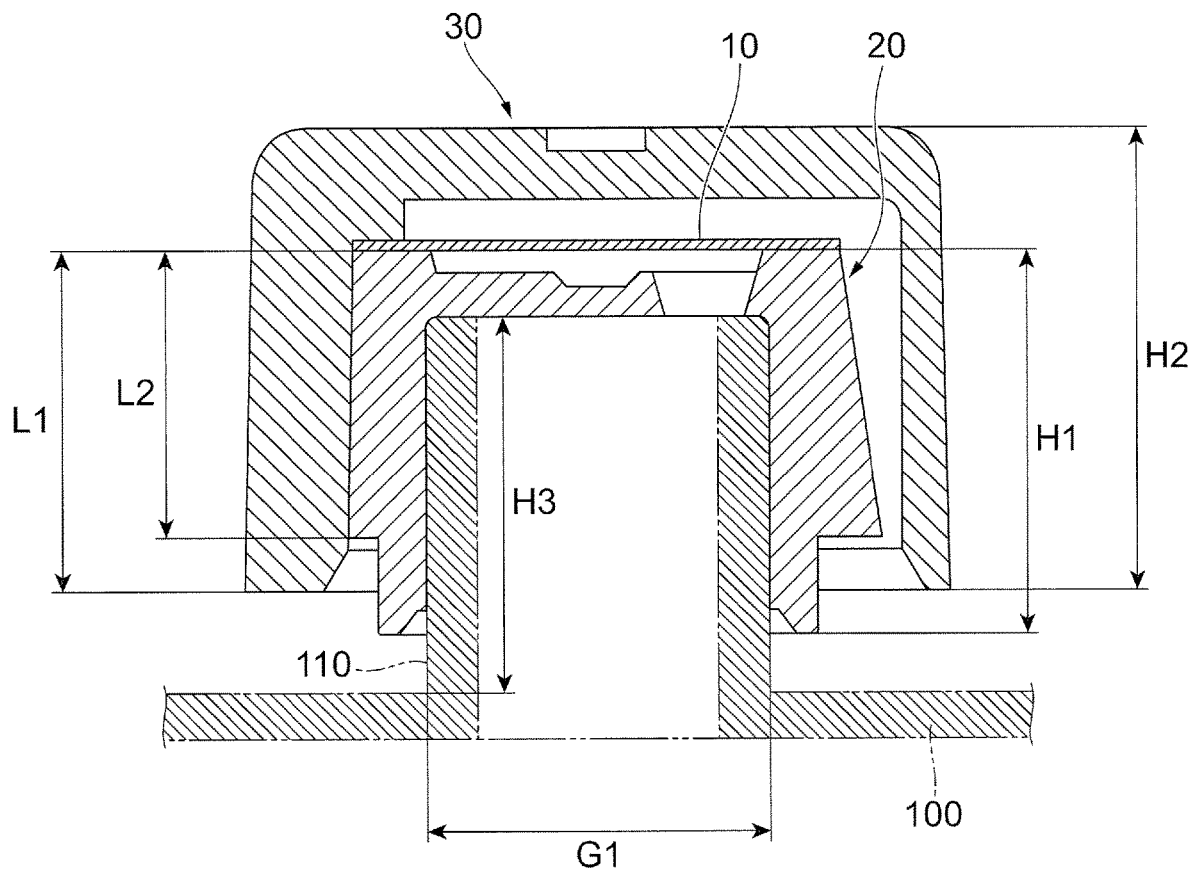
FIG. 8 is a cross-sectional view of the VIII-VIII portion in FIG. 7.

FIG. 7 shows a specific example of the configuration of the ventilation component 1, and FIG. 8 is a cross-sectional view of the VIII-VIII portion in FIG. 7.

By using an olefin-based thermoplastic elastomer (Milastomer (registered trademark) manufactured by Mitsui Chemicals, Inc., hardness 71, density 880 kg/m$^3$) as the material, the attachment member 20 in the shape shown in FIG. 7 was created by injection molding. As described above, the attachment member 20 is a specific example of the internal member. Note that, of the obtained attachment member 20, the maximum thickness was 2.4 mm, the minimum thickness was 1.1 mm, the outer diameter of the maximum thickness portion was Φ12 mm, the outer diameter of the minimum thickness portion was Φ10 mm, the inner diameter was Φ7.5 mm, and the height H1 (refer to FIG. 8) was 8.0 mm.

By using polypropylene (manufactured by Japan Polypropylene Corporation) as the material, the covering member 30 in the shape shown in FIG. 7 was created by injection molding. As described above, the covering member 30 is a specific example of an external member. Note that, of the obtained covering member 30, the maximum thickness was 2.5 mm, the minimum thickness was 0.6 mm, the outer diameter was Φ16 mm, the inner diameter of the maximum thickness portion was t mm, the inner diameter of the minimum thickness portion was Φ13.3 mm, and the height H2 (refer to FIG. 8) was 9.0 mm.

Next, by using PTFE/PE/PET non-woven cloth laminated body (TEMISH "NTF1026-L01" manufactured by Nitto Denko Corporation, ventilation amount 50 cm$^3$/min) as the material, the ventilation membrane 10 was created by punching out with the diameter of Φ12 mm in the non-woven cloth laminated body. Then, the ventilation membrane 10 was disposed to completely cover the opening on one side in the centerline direction of the cylindrical part 21 of the attachment member 20, and was pressed and heated for two seconds at a temperature of 200° C. and a pressure of 20 N/piece, to thereby weld the ventilation membrane 10 to the attachment member 20. The covering member 30 was press-fitted over (attached to) the attachment member 20, to which the ventilation membrane 10 was welded, and thereby the ventilation component 1 was obtained.

By using the 3D printer (Objet30 Prime) and using a hard resin "Vero Black Plus (RGD875)" as the material, a housing lid, which includes a tubular projecting part (attached part 110), of the device housing 100 was created. Note that, of the tubular projecting part, the outer diameter G1 (refer to FIG. 8) was Φ8.5 mm, the inner diameter was Φ5.0 mm, and the height H3 (refer to FIG. 8) was 8.0 mm. The above-described ventilation component 1 was attached to the projecting part of the housing lid (attached until the end portion on the lower side of the attachment member 20 contacts the device housing 100), and thereby the housing lid with the ventilation component 1 was prepared.

In a moisture permeability cup (with an opening with the diameter of 60 mm and an inner diameter according to the Japanese Industrial Standard (JIS) L1099-A2 (water method)), which was statically placed beforehand in a constant temperature and humidity tank with 50% humidity and 40° C. temperature, 42 g of water was contained, and the housing lid with the ventilation component 1 was disposed to be attached at the opening of the cup to cover the entire opening surface of the cup without any gap. The tubular projecting part and the ventilation component 1 were exposed to the outside of the cup. In the state of being attached, the distance between the water surface and the lower surface of the housing lid was 10 mm, and the moisture permeability area of the ventilation component 1 was 44 mm$^2$. Again, the cup was statically placed in the constant temperature and humidity tank with 50% humidity and 40° C. temperature for one hour. Thereafter, the cup was taken out of the constant temperature and humidity tank and the weight W1 (g) of the cup with the housing lid with the ventilation component 1 was measured. Next, the cup was statically placed in the above-described constant temperature and humidity tank, taken out of the tank again, and the weight W2 (g) of the cup with the housing lid with the ventilation component 1 was measured. Then, assuming that the difference in the weight of the cup before and after the second static placement in the constant temperature and humidity tank was A (g) (=W1−W2), and that the area of the opening surface of the cup was B (m$^2$), the moisture permeability was calculated as the moisture permeation performance of the ventilation housing according to the following expression (1).

$$\text{Moisture permeability [gm}^{-2}\text{ h}^{-1}\text{]}=A/B/24 \tag{1}$$

Table 1 shows the calculation results of the moisture permeability with the configuration of each part in the ventilation component 1. Note that "the attachment depth L1 of the covering member 30" in Table 1 means, as shown in FIG. 8, when observed in the direction perpendicular to the center axis of the ventilation component 1, the length of the portion in the attachment member 20 covered with the covering member 30 in the direction along the center axis. In addition, "the inside/outside contact length L2" means, as shown in FIG. 8, when observed in the direction perpendicular to the center axis of the ventilation component 1, the length of the contact portion between the covering member 30 and the attachment member 20 in the direction along the center axis. Moreover, "the ventilation path distance" means the distance as a result of sum of the height H1 of the attachment member 20 and the attachment depth L1 of the covering member 30, and substantially means the distance from the inside of the housing 100 to the exit of the ventilation component 1.

Reference Examples 2 to 5

Except for changing the height H1 of the attachment member 20, the height H2 of the covering member 30, the ventilation amount of the ventilation membrane 10, the height H3 of the tubular projecting part, the attachment depth L1 of the covering member 30, and the inside/outside contact length L2 as shown in Table 1, the ventilation component 1 in the shape shown in FIG. 7 was created by the same method as in Example 1. Then, the moisture permeability test was performed by the same method as in Reference example 1. Table 1 shows the calculation results of the moisture permeability.

Reference Example 6

Figure 9:
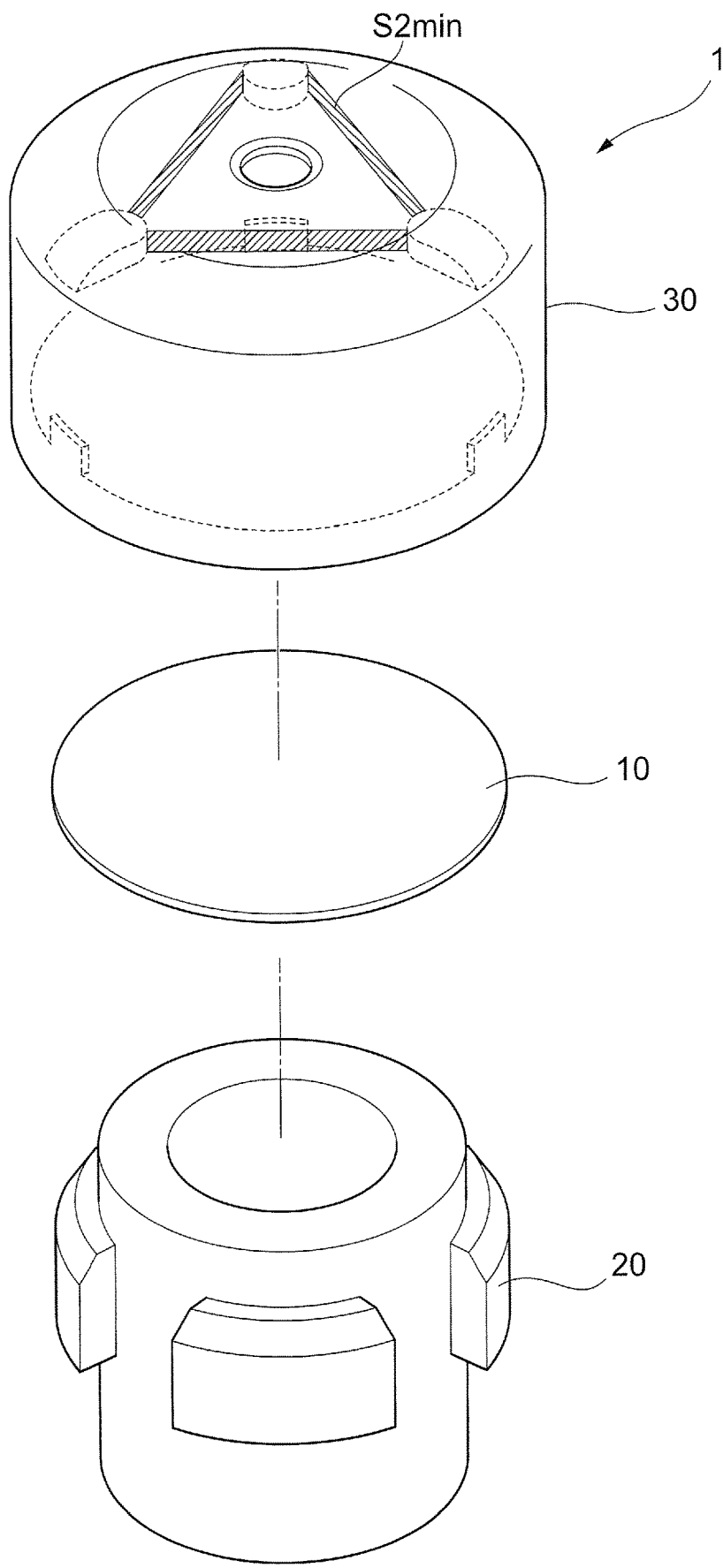
FIG. 9 shows another specific example of the configuration of the ventilation component.

FIG. 9 shows a specific example of the configuration of the ventilation component 1.

With the same method as in Reference example 1, the ventilation component 1 in the shape shown in FIG. 9 was created. Note that the height H1 of the attachment member 20, the height H2 of the covering member 30, the ventilation amount of the ventilation membrane 10, the height H3 of the tubular projecting part, the attachment depth L1 of the covering member 30, and the inside/outside contact length L2 in Reference example 6 are as shown in Table 1. Then, the moisture permeability test was performed by the same method as in Reference example 1. Table 1 shows the calculation results of the moisture permeability.

TABLE 1

| | HEIGHT H1 OF THE ATTACHMENT MEMBER [mm] | HEIGHT H3 OF THE TUBULAR PROJECTING PART [mm] | HEIGHT H2 OF THE COVERING MEMBER [mm] | ATTACHMENT DEPTH L1 OF THE COVERING MEMBER [mm] | INSIDE/ OUTSIDE CONTACT LENGTH L2 [mm] | VENTILA- TION PATH DISTANCE [mm] | VENTILA- TION AMOUNT OF THE VENTILA- TION MEMBRANE [cm³/min] | MOISTURE PERMEABIL- ITY [g/m²/hr] |
|---|---|---|---|---|---|---|---|---|
| REFERENCE EXAMPLE 1 | 8 | 8 | 9 | 7 | 5.5 | 15 | 50 | 60.6 |
| REFERENCE EXAMPLE 2 | | 10 | 6 | 3 | 3 | 11 | | 69.1 |
| REFERENCE EXAMPLE 3 | | | 7 | 5 | 5 | 13 | | 66.7 |
| REFERENCE EXAMPLE 4 | | | 9 | 7 | 5.5 | 15 | | 55.6 |
| REFERENCE EXAMPLE 5 | | 8 | | | | 15 | 13000 | 59.4 |
| REFERENCE EXAMPLE 6 | 12 | 10 | 12 | 10 | 5.05 | 22 | 50 | 49.6 |

Figure 10:
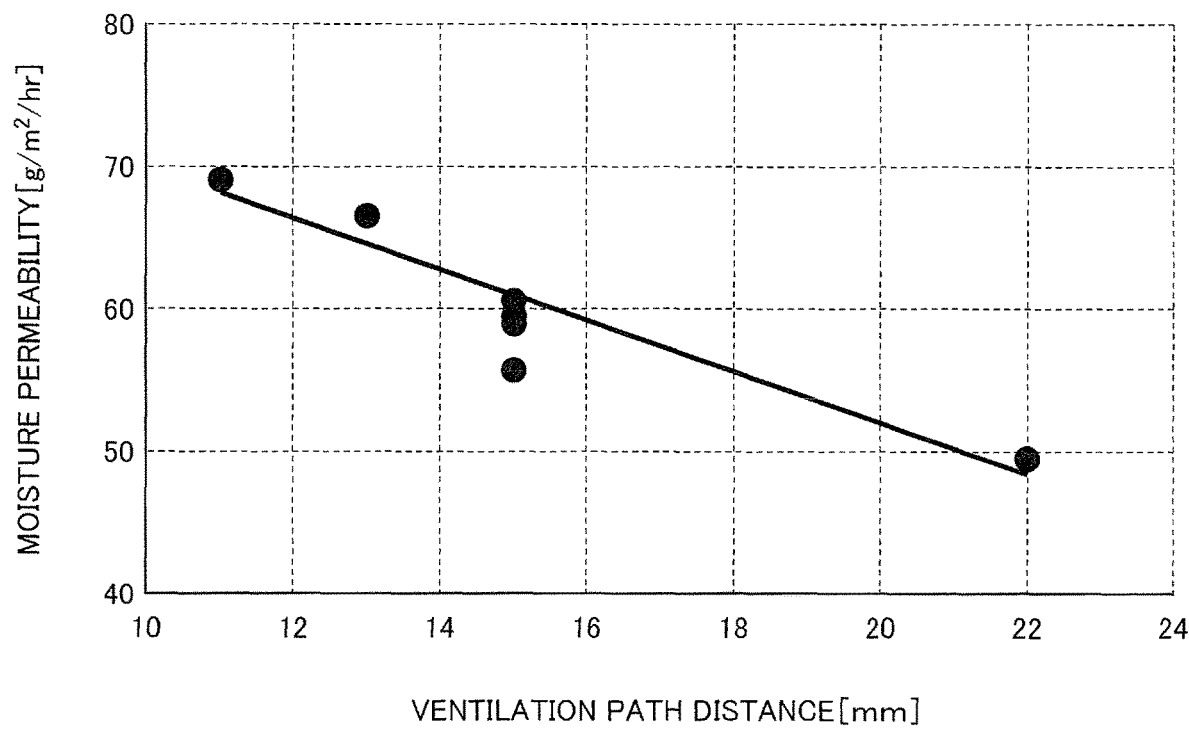
FIG. 10 is a graph plotting the relation between the ventilation path distance and moisture permeability with respect to ventilation components of Reference examples 1 to 6.

FIG. 10 is a graph plotting the relation between the ventilation path distance and the moisture permeability with respect to the ventilation components 1 of Reference examples 1 to 6.

Figure 11:
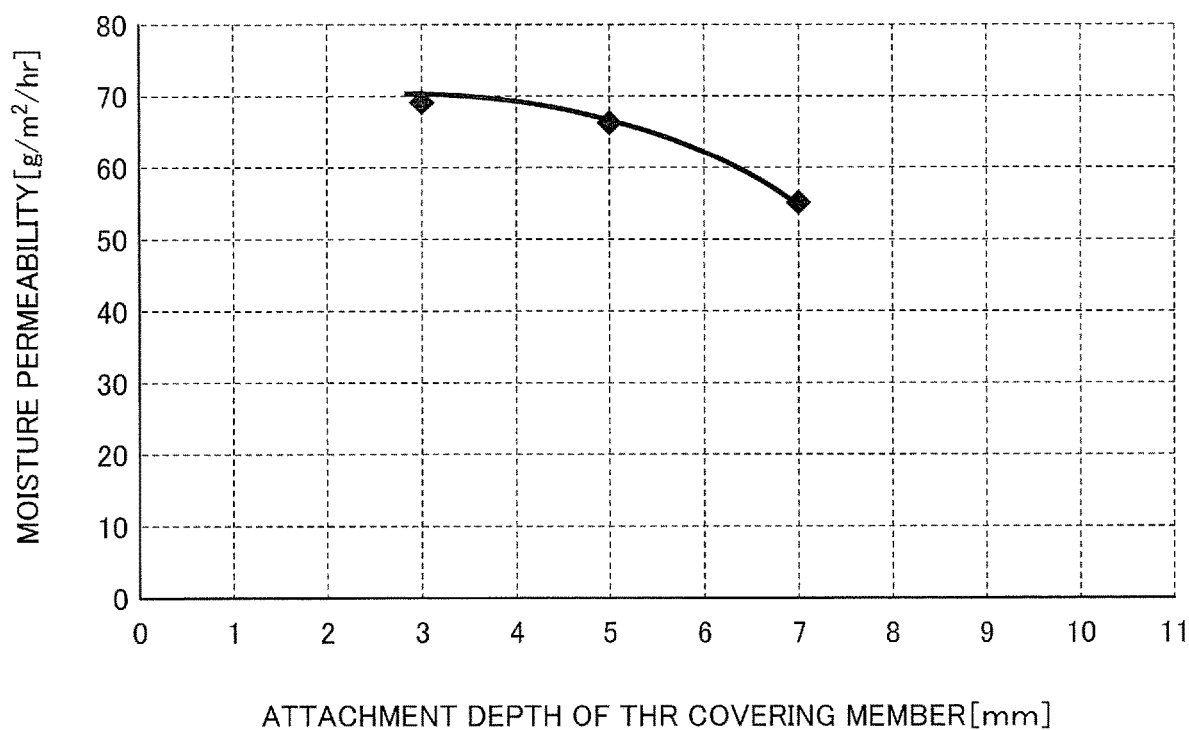
FIG. 11 is a graph plotting the relation between the attachment depth of the covering member and moisture permeability with respect to ventilation components of Reference examples 2 to 4.

FIG. 11 is a graph plotting the relation between the attachment depth L1 of the covering member 30 and the moisture permeability with respect to the ventilation components 1 of Reference examples 2 to 4.

<Moisture Permeability Test 2 for Ventilation Component 1>

Reference Examples 7 to 11

Figure 12:
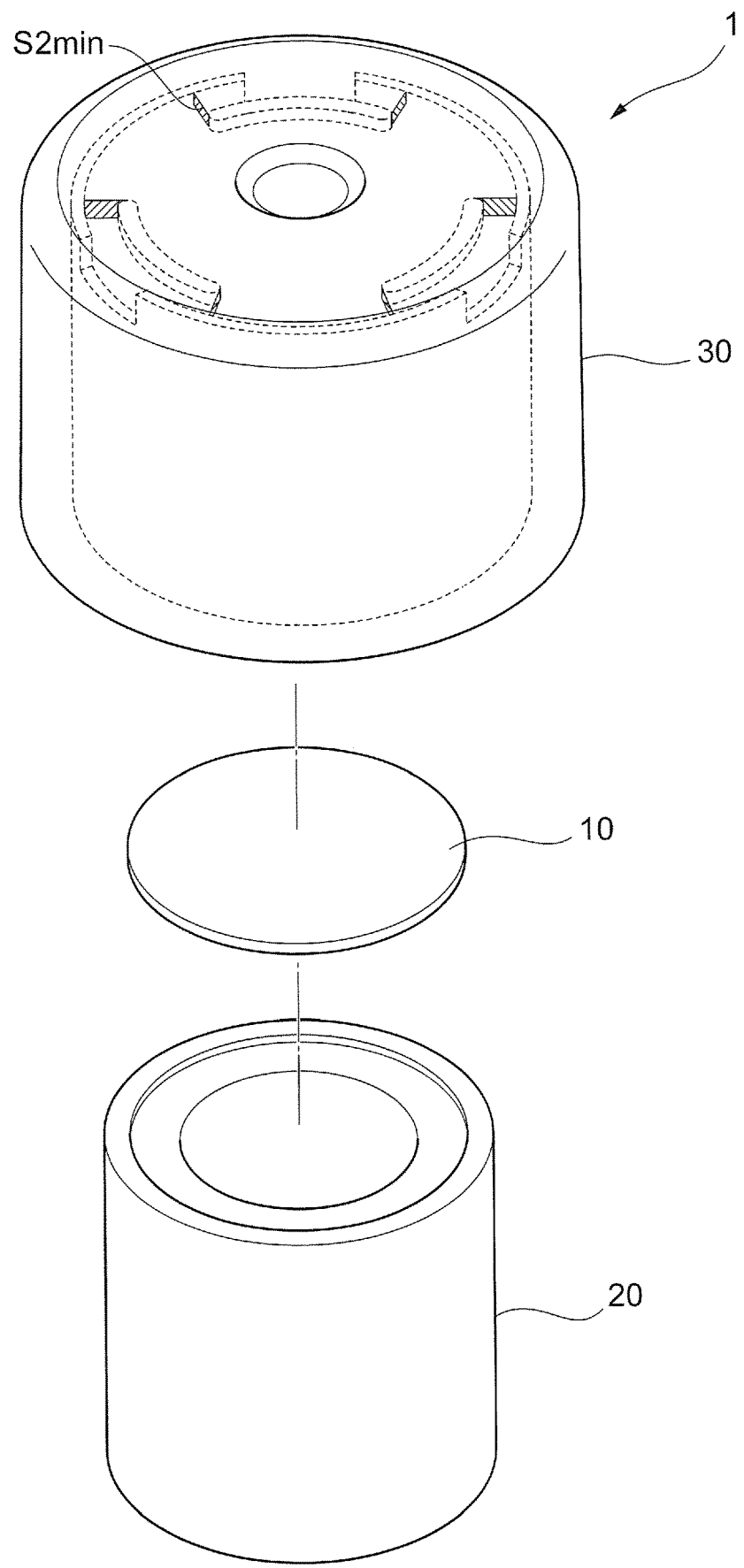
FIG. 12 shows still another example of the configuration of the ventilation component.
Figure 13:
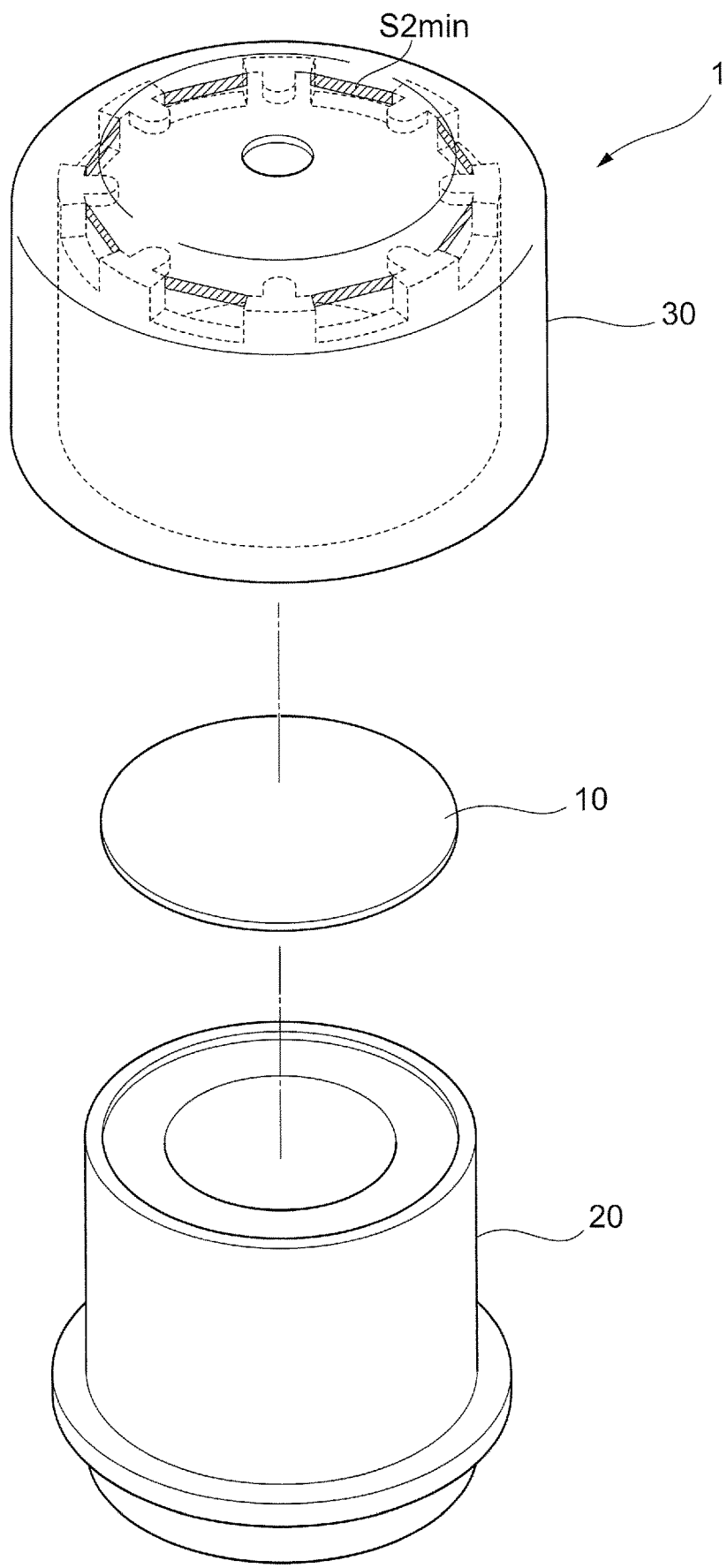
FIG. 13 shows still another example of the configuration of the ventilation component.
Figure 14:
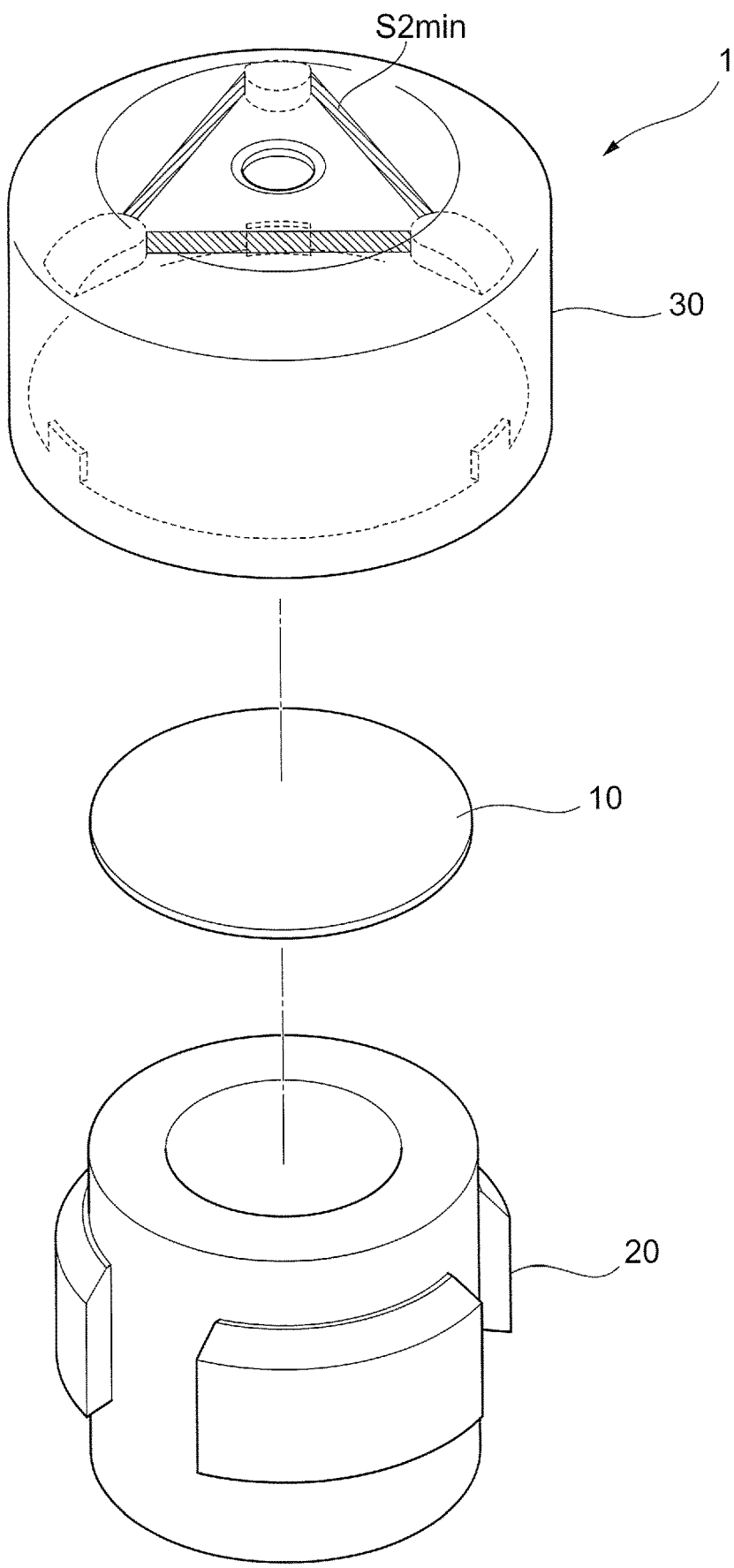
FIG. 14 shows still another example of the configuration of the ventilation component.

Each of FIGS. 12 to 14 shows a specific example of the configuration of the ventilation component 1.

With the same method as in Reference example 1, the ventilation component 1 in the shape shown in FIG. 7 (Reference example 7) and the ventilation component 1 in the shape shown in FIG. 9 (Reference example 8) were created. In addition, the ventilation component 1 in the shape shown in FIG. 12 (Reference example 9), the ventilation component 1 in the shape shown in FIG. 13 (Reference example 10), and the ventilation component 1 in the shape shown in FIG. 14 (Reference example 11) were prepared.

Note that these ventilation components 1 are different in detailed shapes, but the height H1 of the attachment member 20 is 8.0 mm, the height H2 of the covering member 30 is 9.0 mm, the attachment depth L1 of the covering member 30 is 7.0 mm, and the ventilation path distance is 15 mm, which are the same.

Next, the minimum cross-sectional area $S2_{min}$ of the ventilation paths was measured for each of the ventilation components 1 in Reference examples 7 to 11. Note that the "minimum cross-sectional area $S2_{min}$ of the ventilation paths" means the total area at the position where the sum total of the cross-sectional areas of the ventilation paths at a distance from the ventilation membrane 10 becomes the smallest, and corresponds to the area of the portions indicated by the reference sign $S2_{min}$ in FIGS. 7, 9, 12 to 14.

The minimum cross-sectional area $S2_{min}$ of the ventilation paths was obtained as follows. The covering member 30 of each was photographed along the ventilating direction in the ventilation paths to include the narrowest portions of the ventilation paths. Each obtained image was captured by ImageJ, which was image revising software capable of measuring image size, to set the scale in the image data to match the actual measurement value in the size of the ventilation component 1. Next, the sizes of the portions indicated by the reference sign $S2_{min}$ in FIGS. 7, 9, 12 to 14 were measured, and the minimum cross-sectional area $S2_{min}$ of the ventilation paths were calculated based thereon. Note that, with respect to Reference example 11, the area $S2_{min}$ is also the area $S2_{out}$, which will be described later; if the position of the area $S2_{out}$ is excluded, the portions indicated by the reference sign $S2_{min}$ is the minimum cross-sectional area.

Table 2 shows the calculation results of the minimum cross-sectional area $S2_{min}$ of the ventilation paths.

Next, the bottom surface area $S2_{out}$ of the ventilation paths was measured for each of the ventilation components 1 in Reference examples 7 to 11. Note that the "bottom surface area $S2_{out}$ of the ventilation paths" means the total area of the planes representing the cross sections of the ventilation paths at the positions where the ventilation paths become the narrowest when the ventilation paths are observed from the inner space side along the center axis of the ventilation component.

Figures 1, 15A:
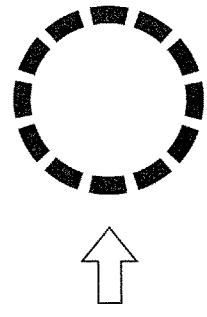
Figures 2, 15A:
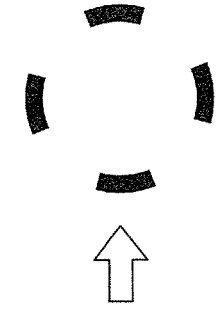
Figures 1, 15B:
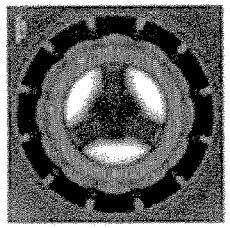
Figures 2, 15B:
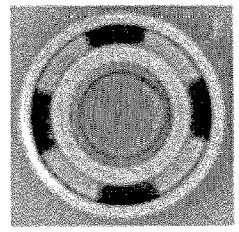
Figures 3, 15B:
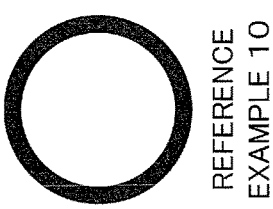
Figures 4, 15B:
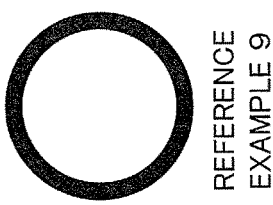
Figures 5, 15B:
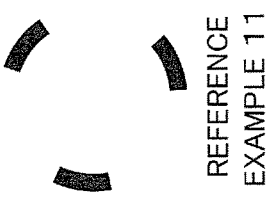

The bottom surface area $S2_{out}$ of the ventilation paths was obtained as follows. Each ventilation component 1 was photographed from the bottom surface side, and the obtained image was captured by ImageJ, which was the image analysis software capable of performing image binarization processing and measuring the size and area of the image. The image resolution was set to 8 bits, the contrast was adjusted to clearly show the bottom surfaces of the ventilation paths, and the scale was set in the image data to match the actual measurement value in the size of the ventilation component 1. Then, the threshold value for the binarization processing was set so that only the planes representing the positions where the ventilation paths became the narrowest were extracted, and the image in which only the bottom surfaces of the ventilation paths were shown black was created. FIGS. 15A-1 and 15A-2 show the procedures of creating the image of planes indicating the positions of the narrowest ventilation paths from a photograph of the ventilation component 1 taken from the bottom surface side by using binarization processing. FIG. 15A-1 corresponds to Reference example 7, and FIG. 15A-2 corresponds to Reference example 11. FIGS. 15B-1 to 15B-5 are images of the planes each indicating the positions of the narrowest ventilation paths obtained with respect to Reference examples 7 to 11, respectively. In the case where the portion other than the bottom surfaces of the ventilation paths are black, the portions are removed to complete the images shown in FIGS. 15A-1, 15A-2, 15B-1 to 15B-5. Finally, the area of the black portions was calculated based on the scale, and thereby the bottom surface area $S2_{out}$ of the ventilation paths was calculated.

Table 2 shows the calculation results of the bottom surface area $S2_{out}$ of the ventilation paths.

Then, with the same method as the above-described <moisture permeability test 1 for ventilation component 1>, the housing lid with the ventilation component 1 was prepared and the moisture permeability test was performed. Table 2 shows the calculation results of the moisture permeability.

Note that, of the tubular projecting part in the housing lid, the outer diameter G1 is Φ8.5 mm, the inner diameter is 05.0 mm, and the height H3 is 6.0 mm. In addition, the cross-sectional area S1 of the communicating hole providing communication between the inner space and the outer space of the housing, which is cut by a plane perpendicular to the center axis of the ventilation component 1, is 19.6 mm².

Inc., hardness 71, density 880 kg/m³) as the material, the attachment member 20 in the shape shown in FIG. 9 was created by injection molding. Note that, of the obtained attachment member 20, the maximum thickness (the thickness of the portion including the protruding part) was 4.2 mm, the minimum thickness (the thickness of the portion including no protruding part) was 2.3 mm, the outer diameter of the portion including the protruding part was Φ16 mm, the outer diameter of the portion including no protruding part was Φ12 mm, the inner diameter was Φ7.5 mm, and the height H1 was 6.0 mm.

Next, as the tubular projecting part of the device housing 100, a tubular projecting part made of polypropylene (PP) in a cylindrical shape was prepared. Note that, of the tubular projecting part, the outer diameter G1 was Φ8.5 mm, the inner diameter was Φ5.0 mm, and the height was 6.0 mm.

At the upper portion of the attachment member 20 (on a side opposite to the side to be inserted into the tubular projecting part), a hole was made with a pin of Φ0.5 mm, and a clip was passed therethrough. Next, the attachment member 20 (height H1: 6.0 mm) was attached all the way to the tubular projecting part (height H3: 6.0 mm) from the lower portion thereof.

The clip was fastened to a tension tester (Autograph "AGS-X" manufactured by Shimadzu Corporation) and the tubular projecting part was fastened so that the attachment direction of the attachment member 20 into the tubular projecting part was perpendicular to a displacing direction of the tension tester. At the tension rate of 200 mm/min, the drawing test for the attachment member 20 was performed.

TABLE 2

|  | AREA S1 [mm²] | AREA $S2_{min}$ [mm²] | AREA $S2_{out}$ [mm²] | AREA $S2_{min}$/ AREA S1 | AREA $S2_{out}$/ AREA S1 | MOISTURE PERMEABILITY [g/m²/hr] |
|---|---|---|---|---|---|---|
| REFERENCE EXAMPLE 7 | 19.6 | 21.7 | 44.1 | 1.1 | 2.2 | 57.5 |
| REFERENCE EXAMPLE 8 |  | 23.9 | 26.7 | 1.2 | 1.4 | 49.0 |
| REFERENCE EXAMPLE 9 |  | 6.3 | 47.7 | 0.3 | 2.4 | 42.4 |
| REFERENCE EXAMPLE 10 |  | 22.4 | 50.7 | 1.1 | 2.6 | 68.8 |
| REFERENCE EXAMPLE 11 |  | 19.2 (25.4) | 19.2 | 1.0 (1.3) | 1.0 | 42.4 |

Here, in Reference example 11, the area $S2_{min}$=the area $S2_{out}$ as described above; however, the numeric values in parentheses in Table 2 represent the total area of the positions of the smallest areas in the case where the area $S2_{out}$ is excluded.

Figure 16:
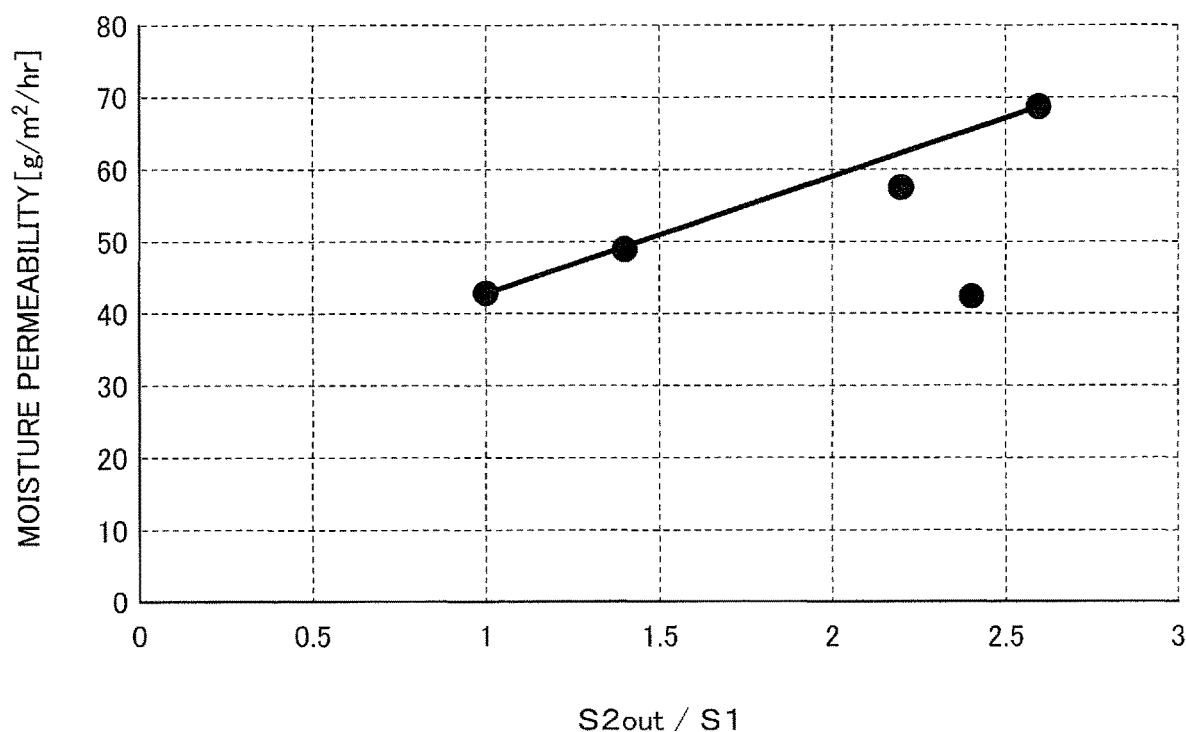
FIG. 16 is a graph plotting the relation between the ratio of the cross-sectional area of the communicating hole and the area of the bottom surfaces of the ventilation paths and moisture permeability with respect to ventilation components of Reference examples 7 to 11.

FIG. 16 is a graph plotting the relation between the ratio $S2_{out}/S1$ of the cross-sectional area S1 of the communicating hole and the bottom surface area $S2_{out}$ of the ventilation paths and moisture permeability with respect to ventilation components 1 in Reference examples 7 to 11.
<Drawing Test for Attachment Member 20>

Reference Example 12

Figure 17:
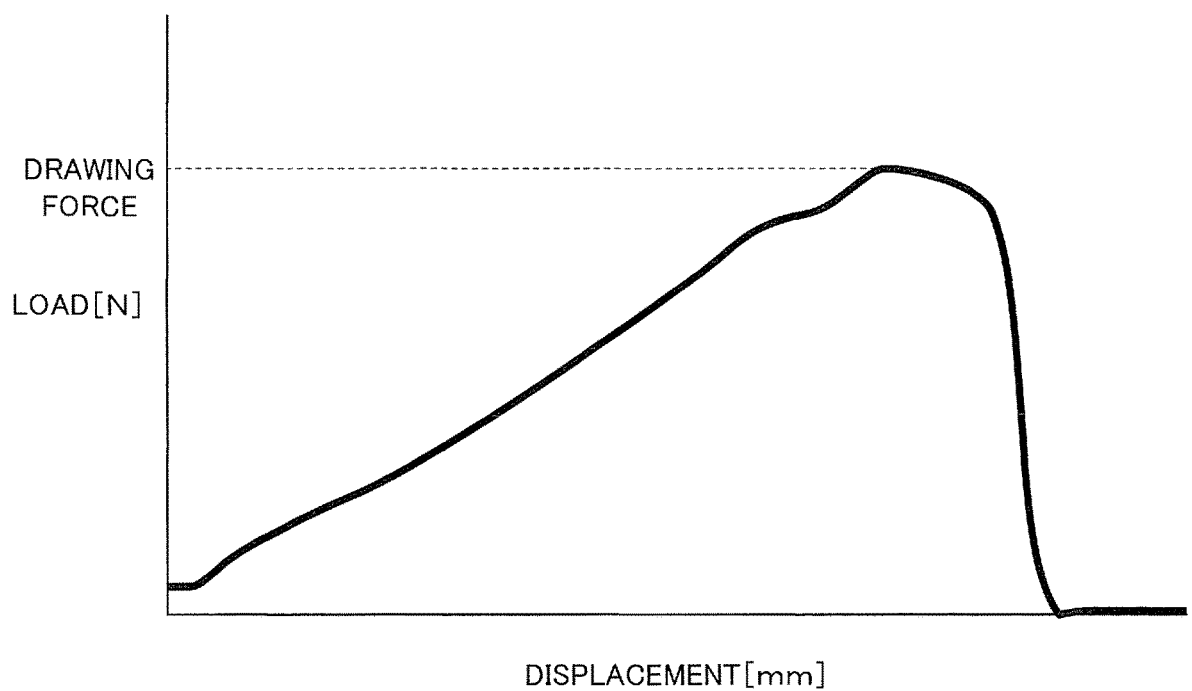
FIG. 17 shows the SS curve obtained by the tension test.

With the same method as in Reference example 1, by using an olefin-based thermoplastic elastomer (Milastomer (registered trademark) manufactured by Mitsui Chemicals, FIG. 17 shows the SS curve obtained by the tension test. The value of the maximum load in the SS curve shown in FIG. 17 was determined as the drawing force for the attachment member 20. Table 3-1 and 3-2 show the measurement results of the drawing force for the attachment member 20 by the tension test and the phenomena caused by the tension test.

Reference Examples 13 to 40

Except for changing the height H1 of the attachment member 20 and the height H3 of the tubular projecting part as shown in Table 3-1 and 3-2, the attachment member 20 in the shape shown in FIG. 9 was created by the same method as in Reference example 12. Then, by the same method as in Reference example 12, the tension test (the drawing test for the attachment member 20) was performed to measure the drawing force.

Table 3-1 and 3-2 show the measurement results of the drawing force by the tension test and the phenomena caused by the tension test.

TABLE 3-1

| | HEIGHT H1 OF THE ATTACHMENT MEMBER [mm] | HEIGHT H3 OF THE TUBULAR PROJECTING PART [mm] | H1/H3 | DRAWING FORCE [N] | PHENOMENA CAUSED BY THE TENSION TEST |
|---|---|---|---|---|---|
| REFERENCE EXAMPLE 12 | 6 | 6 | 1.0 | 44.1 | ATTACHMENT MEMBER IS BROKEN WITHOUT BEING DRAWN OUT |
| REFERENCE EXAMPLE 13 | | 5 | 1.2 | 22.7 | ATTACHMENT MEMBER IS DRAWN OUT |
| REFERENCE EXAMPLE 14 | | 4 | 1.5 | 11.5 | ATTACHMENT MEMBER IS DRAWN OUT |
| REFERENCE EXAMPLE 15 | | 3 | 2.0 | 0.5 | ATTACHMENT MEMBER IS DRAWN OUT |
| REFERENCE EXAMPLE 16 | 7 | 7 | 1.0 | 34.8 | ATTACHMENT MEMBER IS BROKEN WITHOUT BEING DRAWN OUT |
| REFERENCE EXAMPLE 17 | | 6 | 1.2 | 31.3 | ATTACHMENT MEMBER IS DRAWN OUT |
| REFERENCE EXAMPLE 18 | | 5 | 1.4 | 22.2 | ATTACHMENT MEMBER IS DRAWN OUT |
| REFERENCE EXAMPLE 19 | | 4 | 1.8 | 9.6 | ATTACHMENT MEMBER IS DRAWN OUT |
| REFERENCE EXAMPLE 20 | | 2 | 3.5 | 2.4 | ATTACHMENT MEMBER IS DRAWN OUT |
| REFERENCE EXAMPLE 21 | 8 | 8 | 1.0 | 42.6 | ATTACHMENT MEMBER IS BROKEN WITHOUT BEING DRAWN OUT |
| REFERENCE EXAMPLE 22 | | 6 | 1.3 | 25.8 | ATTACHMENT MEMBER IS DRAWN OUT |
| REFERENCE EXAMPLE 23 | | 5 | 1.6 | 19.4 | ATTACHMENT MEMBER IS DRAWN OUT |
| REFERENCE EXAMPLE 24 | | 4 | 2.0 | 7.6 | ATTACHMENT MEMBER IS DRAWN OUT |
| REFERENCE EXAMPLE 25 | | 2 | 4.0 | 3.4 | ATTACHMENT MEMBER IS DRAWN OUT |

TABLE 3-2

| | HEIGHT H1 OF THE ATTACHMENT MEMBER [mm] | HEIGHT H3 OF THE TUBULAR PROJECTING PART [mm] | H1/H3 | DRAWING FORCE [N] | PHENOMENA CAUSED BY THE TENSION TEST |
|---|---|---|---|---|---|
| REFERENCE EXAMPLE 26 | 9 | 9 | 1.0 | 42.6 | ATTACHMENT MEMBER IS BROKEN WITHOUT BEING DRAWN OUT |
| REFERENCE EXAMPLE 27 | | 8 | 1.1 | 44.4 | ATTACHMENT MEMBER IS BROKEN WITHOUT BEING DRAWN OUT |
| REFERENCE EXAMPLE 28 | | 6 | 1.5 | 24.4 | ATTACHMENT MEMBER IS DRAWN OUT |
| REFERENCE EXAMPLE 29 | | 4 | 2.3 | 8.5 | ATTACHMENT MEMBER IS DRAWN OUT |
| REFERENCE EXAMPLE 30 | | 2 | 4.5 | 2.7 | ATTACHMENT MEMBER IS DRAWN OUT |
| REFERENCE EXAMPLE 31 | 10 | 10 | 1.0 | 48.4 | ATTACHMENT MEMBER IS BROKEN WITHOUT BEING DRAWN OUT |
| REFERENCE EXAMPLE 32 | | 8 | 1.3 | 40.8 | ATTACHMENT MEMBER IS BROKEN WITHOUT BEING DRAWN OUT |
| REFERENCE EXAMPLE 33 | | 6 | 1.7 | 24.8 | ATTACHMENT MEMBER IS DRAWN OUT |
| REFERENCE EXAMPLE 34 | | 4 | 2.5 | 5.6 | ATTACHMENT MEMBER IS DRAWN OUT |
| REFERENCE EXAMPLE 35 | | 2 | 5.0 | 3.2 | ATTACHMENT MEMBER IS DRAWN OUT |
| REFERENCE EXAMPLE 36 | 12 | 10 | 1.2 | 41.5 | ATTACHMENT MEMBER IS BROKEN WITHOUT BEING DRAWN OUT |
| REFERENCE EXAMPLE 37 | | 8 | 1.5 | 41.0 | ATTACHMENT MEMBER IS DRAWN OUT |
| REFERENCE EXAMPLE 38 | | 6 | 2.0 | 19.2 | ATTACHMENT MEMBER IS DRAWN OUT |
| REFERENCE EXAMPLE 39 | | 4 | 3.0 | 6.0 | ATTACHMENT MEMBER IS DRAWN OUT |

TABLE 3-2-continued

| | HEIGHT H1 OF THE ATTACHMENT MEMBER [mm] | HEIGHT H3 OF THE TUBULAR PROJECTING PART [mm] | H1/H3 | DRAWING FORCE [N] | PHENOMENA CAUSED BY THE TENSION TEST |
|---|---|---|---|---|---|
| REFERENCE EXAMPLE 40 | | 2 | 6.0 | 1.9 | ATTACHMENT MEMBER IS DRAWN OUT |

Figure 18:
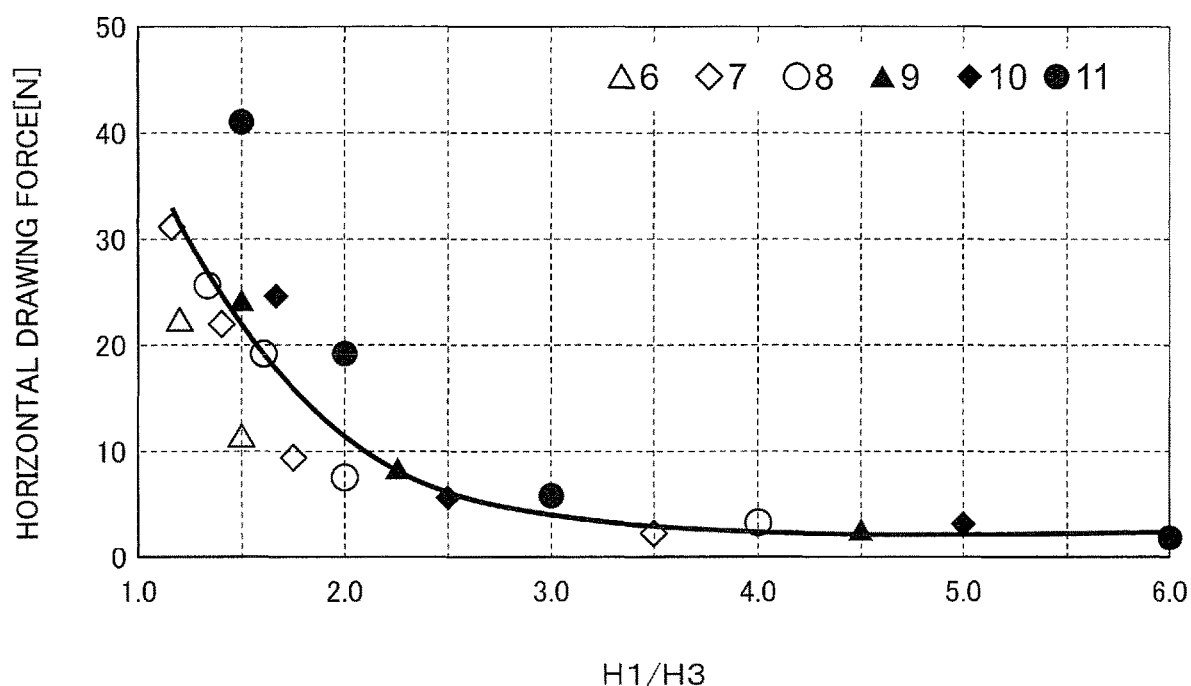
FIG. 18 is a graph plotting the relation between the ratio of the height of the tubular projecting part and the height of the attachment member and a drawing force with respect to the reference examples in which the attachment member is drawn out without breakage in the tension test of Reference examples 12 to 40.

FIG. 18 is a graph plotting the relation between the ratio H1/H3 of the height H3 of the tubular projecting part and the height H1 of the attachment member 20 and a drawing force with respect to the reference examples in which the attachment member 20 is drawn out without breakage in the tension test of Reference examples 12 to 40.

<Drawing Test for Covering Member 30>

Reference Example 41

With the same method as in Reference example 1, by using an olefin-based thermoplastic elastomer (Milastomer (registered trademark) manufactured by Mitsui Chemicals, Inc., hardness 71, density 880 kg/m$^3$) as the material, the attachment member 20 in the shape shown in FIG. 9 was created by injection molding. Note that, of the obtained attachment member 20, the maximum thickness (the thickness of the portion including the protruding part) was 4.2 mm, the minimum thickness (the thickness of the portion including no protruding part) was 2.3 mm, the outer diameter of the portion including the protruding part was Φ16 mm, the outer diameter of the portion including no protruding part was Φ12 mm, the inner diameter was Φ7.5 mm, and the height H1 was 6.0 mm.

Next, by the same method as in Reference example 1, by using polypropylene (manufactured by Japan Polypropylene Corporation) as the material, the covering member 30 in the shape shown in FIG. 9 was created by injection molding. Note that, of the obtained covering member 30, the thickness was 1.0 mm, the outer diameter was Φ17.5 mm, the inner diameter was Φ15.6 mm, and the height H2 was 12 mm.

Next, as the tubular projecting part of the device housing 100, a tubular projecting part made of polypropylene (PP) in a cylindrical shape was prepared. Note that, of the tubular projecting part, the outer diameter G1 was Φ8.1 mm, the inner diameter was Φ5.0 mm, and the height was 10.0 mm.

At the upper portion of the covering member 30 (on a side opposite to the side to be inserted into the attachment member 20), a hole was made, and a screw was passed therethrough. Next, the covering member 30 was press-fitted over (attached to) the attachment member 20 so that the attachment depth L1 of the covering member 30 was 10 mm, to thereby obtain the ventilation component 1. Then, the obtained ventilation component 1 was attached all the way to the tubular projecting part (height H3: 10 mm).

The screw was fastened to a tension tester (Autograph "AGS-X" manufactured by Shimadzu Corporation) and the tubular projecting part was fastened so that the displacing direction of the tension tester matched the attachment direction of the ventilation component 1 into the tubular projecting part. At the tension rate of 200 mm/min, the tension test for the ventilation component 1 was performed.

Figure 19:
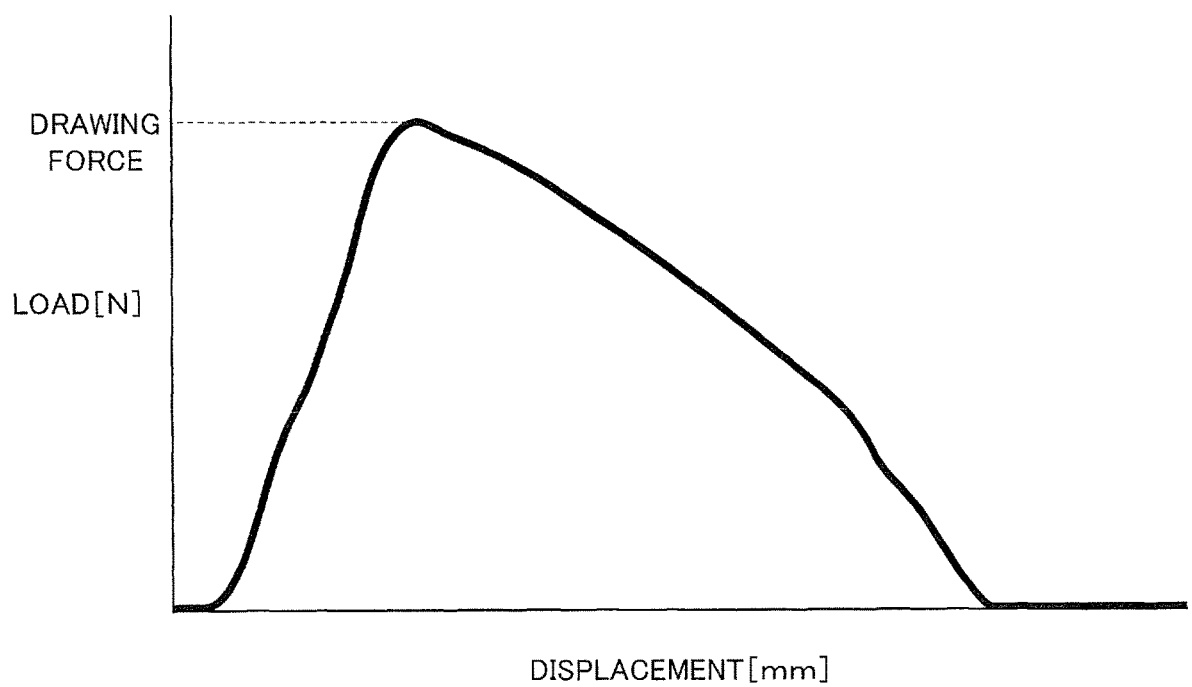
FIG. 19 shows the SS curve obtained by the tension test.

FIG. 19 shows the SS curve obtained by the tension test. The value of the maximum load in the SS curve shown in FIG. 19 was determined as the drawing force for the ventilation component 1. Table 4 shows the measurement results of the drawing force for the ventilation component 1 by the tension test.

Reference Examples 42 to 52

Except for changing the outer diameter G1 of the tubular projecting part, the height H2 of the covering member 30, and the attachment depth L1 of the covering member 30 were changed as shown in Table 4, the covering member 30 was created by the same method as in Reference example 41, and the tubular projecting part was prepared. Then, by the same method as in Reference example 41, the tension test (the drawing test for the ventilation component 1) was performed to measure the drawing force.

Table 4 shows the measurement results of the drawing force for the ventilation component 1 by the tension test.

TABLE 4

| | HEIGHT H1 OF THE ATTACHMENT MEMBER [mm] | HEIGHT H3 OF THE TUBULAR PROJECTING PART [mm] | OUTER DIAMETER G1 OF THE TUBULAR PROJECTING PART [mm] | HEIGHT H2 OF THE COVERING MEMBER [mm] | ATTACHMENT DEPTH L1 OF THE COVERING MEMBER [mm] | INSIDE/ OUTSIDE CONTACT LENGTH L2 [mm] | DRAWING FORGE [N] |
|---|---|---|---|---|---|---|---|
| REFERENCE EXAMPLE 41 | 12 | 10 | 8.1 | 12 | 10 | 5.5 | 31.4 |
| REFERENCE EXAMPLE 42 | | | | | 9 | 5.5 | 32.9 |
| REFERENCE EXAMPLE 43 | | | | | 8 | 5.5 | 27.69 |
| REFERENCE EXAMPLE 44 | | | | | 7 | 5.5 | 22.45 |
| REFERENCE EXAMPLE 45 | | | | | 6 | 5.5 | 16.93 |
| REFERENCE EXAMPLE 46 | | | | | 5 | 5 | 9.87 |

TABLE 4-continued

| | HEIGHT H1 OF THE ATTACHMENT MEMBER [mm] | HEIGHT H3 OF THE TUBULAR PROJECTING PART [mm] | OUTER DIAMETER G1 OF THE TUBULAR PROJECTING PART [mm] | HEIGHT H2 OF THE COVERING MEMBER [mm] | ATTACHMENT DEPTH L1 OF THE COVERING MEMBER [mm] | INSIDE/ OUTSIDE CONTACT LENGTH L2 [mm] | DRAWING FORCE [N] |
|---|---|---|---|---|---|---|---|
| REFERENCE EXAMPLE 47 | | | 8.5 | 12 | 10 | 5.5 | 37.86 |
| REFERENCE EXAMPLE 48 | | | | | 9 | 5.5 | 36.31 |
| REFERENCE EXAMPLE 49 | | | | | 8 | 5.5 | 32.46 |
| REFERENCE EXAMPLE 50 | | | | | 7 | 5.5 | 27.28 |
| REFERENCE EXAMPLE 51 | | | | | 6 | 5.5 | 19.36 |
| REFERENCE EXAMPLE 52 | | | | | 5 | 5 | 9.19 |

Figure 20:
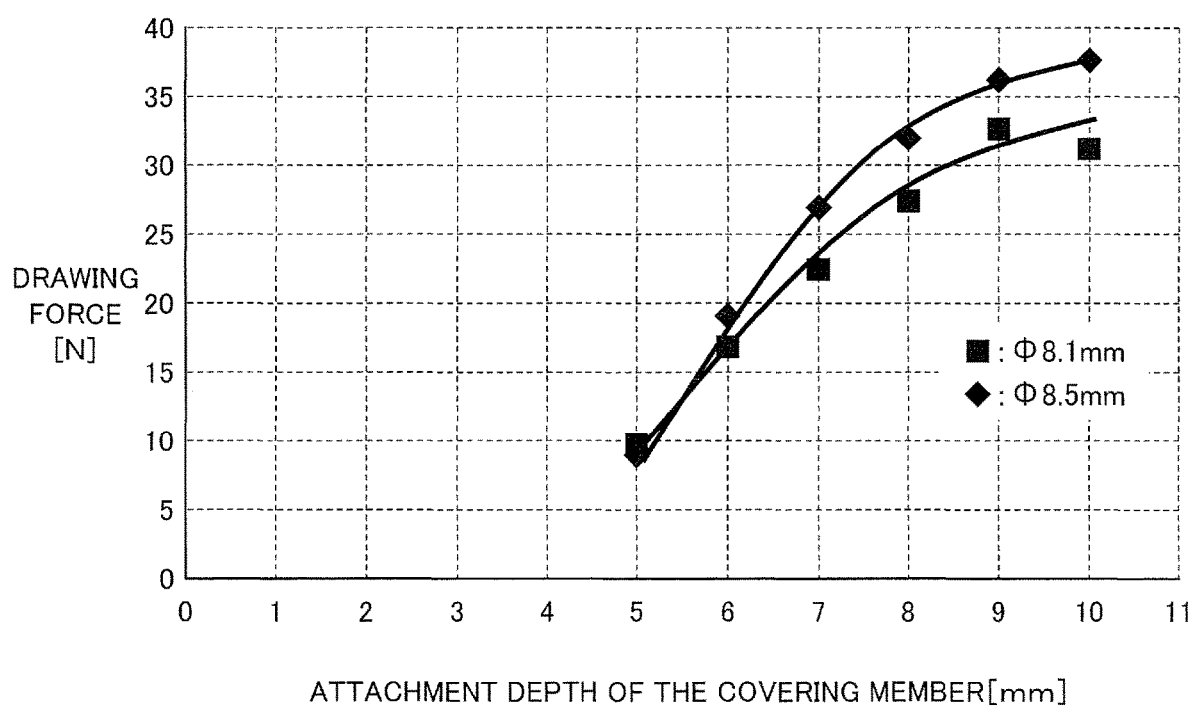
FIG. 20 is a graph plotting the relation between the attachment depth of the covering member and the drawing force with respect to ventilation components of Reference examples 41 to 52.

FIG. 20 is a graph plotting the relation between the attachment depth L1 of the covering member 30 and the drawing force with respect to the ventilation components 1 of Reference examples 41 to 52.

REFERENCE SIGNS LIST

1 Ventilation component
10 Ventilation membrane
20 Attachment member
21 Cylindrical part
22 Outward protruding part
23 Coupling part
30 Covering member
31 Side wall part
32 Inward protruding part
33 Top part
34 Other-side protruding part
100 Device housing
110 Attached part

The invention claimed is:

1. A ventilation housing comprising:
a housing; and
a ventilation component,
the housing including a tubular projecting part protruded from the housing, the projecting part including a communicating hole formed therein to communicate inner space and outer space of the housing, the ventilation component comprising:
a tubular attachment member made of an elastic body, the attachment member being press-fitted over the projecting part to be attached thereon so as to bring an inner surface of the attachment member into contact with an outer surface of the projecting part;
a ventilation body supported by the attachment member to cover an end portion of the communicating hole with the attachment member, and providing ventilation between the inner space and the outer space; and
a covering member including a peripheral part disposed around an outer surface of the attachment member and a top part covering the ventilation body with the peripheral part, the covering member being press-fitted over the attachment member so as to bring an inner surface of the peripheral part into contact with the outer surface,
at least one selected from an interior of the attachment member, an interior of the covering member, and a gap between the outer surface of the attachment member and the peripheral part of the covering member including at least one ventilation path connecting the ventilation body and the outer space, and
a first contact part positioning closer to the inner space than an end portion on the outer space side in a second contact part, the first contact part being a contact portion between an outermost protruding portion protruding from the outer surface of the attachment member and the inner surface of the peripheral part of the covering member, and the second contact part being a contact portion between the outer surface of the projecting part of the housing and the inner surface of the attachment member.

2. The ventilation housing according to claim 1, wherein the outer surface of the attachment member is inclined to gradually protrude outward from the outer surface with a move toward the outer space.

3. The ventilation housing according to claim 1, wherein a distance in a hole direction of the communicating hole in the second contact part is 5 mm to 8 mm, and a distance in the hole direction between the first contact part and the end portion on the outer space side in the second contact part is 0.5 mm to 6 mm.

4. The ventilation housing according to claim 1, wherein the attachment member includes an intervention part between a portion forming the second contact part with the projecting part and a portion supporting the ventilation body.

5. The ventilation housing according to claim 1, wherein the peripheral part of the covering member includes a tubular side wall part and inward protruding parts protruding from an inner surface of the side wall part, inside surfaces of the inward protruding parts serving as the inner surface forming the first contact part with the outer surface of the attachment member, and the number of the inward protruding parts is 6 to 16, the inward protruding parts being disposed at regular intervals in a circumferential direction of the outer surface of the attachment member.

6. The ventilation housing according to claim 1, wherein the attachment member is made of an elastic body containing a thermoplastic resin or a thermosetting resin, and a convex-shaped gate projection, or a gate remainder and residue after removal thereof exist on a side surface of the attachment member, the gate projection arising from a gate for filling a mold used for manufacturing the attachment member with a thermoplastic material or a thermosetting material.

7. The ventilation housing according to claim 1, wherein a height from one end portion to the other end portion of the attachment member is 6 mm or more and 10 mm or less.

8. The ventilation housing according to claim 1, wherein, when observed from a direction perpendicular to a center axis of the ventilation component, a length of a portion in the attachment member in a direction along the center axis covered with the peripheral part of the covering member is 6.0 mm or more and 8.0 mm or less.

9. The ventilation housing according to claim 1, wherein at least one of the covering member and the attachment member includes a locking mechanism detachably joining the covering member and the attachment member.

10. The ventilation housing according to claim 1, wherein a ratio $S2_{min}/S1$ is 1.0 or more, S1 being a cross-sectional area of the communicating hole cut by a plane perpendicular to a center axis of the projecting part, and $S2_{min}$ being a total area at positions where the total area, which is a sum of cross-sectional areas of the ventilation paths cut by planes perpendicular to each ventilating direction at each distance from the ventilation body, becomes smallest.

11. The ventilation housing according to claim 1, wherein a ratio $S2_{out}/S1$ is 1.0 or more, S1 being a cross-sectional area of the communicating hole cut by a plane perpendicular to a center axis of the projecting part, and $S2_{out}$ being a total area of planes representing cross sections at positions where the ventilation paths become narrowest when the ventilation paths are observed from the inner space side along a center axis of the ventilation component.

* * * * *